US012015063B2

(12) United States Patent
Lee et al.

(10) Patent No.: US 12,015,063 B2
(45) Date of Patent: Jun. 18, 2024

(54) METHOD OF MANUFACTURING AN INTEGRATED CIRCUIT DEVICE INCLUDING A FIN-TYPE ACTIVE REGION

(71) Applicant: SAMSUNG ELECTRONICS CO., LTD., Suwon-si (KR)

(72) Inventors: Chang-yeon Lee, Hwaseong-si (KR); Jin-wook Lee, Seoul (KR); Min-chan Gwak, Hwaseong-si (KR); Kye-Hyun Baek, Suwon-si (KR); Hong-bae Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 128 days.

(21) Appl. No.: 17/707,036

(22) Filed: Mar. 29, 2022

(65) Prior Publication Data

US 2022/0223702 A1    Jul. 14, 2022

Related U.S. Application Data

(63) Continuation of application No. 16/404,857, filed on May 7, 2019, now Pat. No. 11,309,393.

(30) Foreign Application Priority Data

Jul. 26, 2018   (KR) .................. 10-2018-0087280

(51) Int. Cl.
*H01L 29/417*   (2006.01)
*H01L 21/8234*   (2006.01)
(Continued)

(52) U.S. Cl.
CPC ............. *H01L 29/41791* (2013.01); *H01L 21/823431* (2013.01); *H01L 21/823475* (2013.01); *H01L 27/0886* (2013.01); *H01L 29/7851* (2013.01)

(58) Field of Classification Search
CPC ..... H01L 21/823431; H01L 21/823475; H01L 21/76831; H01L 21/76883;
(Continued)

(56) References Cited

U.S. PATENT DOCUMENTS 8,937,359 B2   1/2015 Xie et al.
9,379,058 B2   6/2016 Song et al.
(Continued)

FOREIGN PATENT DOCUMENTS

CN   106847812 A   6/2017
CN   107275281 A   12/2017
(Continued)

*Primary Examiner* — Nelson Garces
(74) *Attorney, Agent, or Firm* — Muir Patent Law, PLLC

(57) ABSTRACT

An integrated circuit device including a substrate; a fin-type active region protruding from the substrate; a gate line intersecting the fin-type active region and covering a top surface and side walls thereof; a gate insulating capping layer covering the gate line; source/drain regions at sides of the gate line on the fin-type active region; first conductive plugs connected to the source/drain regions; a hard mask layer covering the first conductive plugs; and a second conductive plug between the first conductive plugs, the second conductive plug connected to the gate line by passing through the gate insulating capping layer and having a top surface higher than the top surface of each first conductive plug, wherein the hard mask layer protrudes from the first conductive plugs and toward the second conductive plug so that a portion of the hard mask layer overhangs from an edge of the first conductive plugs.

20 Claims, 32 Drawing Sheets

(51) Int. Cl.
  *H01L 27/088* (2006.01)
  *H01L 29/78* (2006.01)

(58) Field of Classification Search
  CPC ......... H01L 21/76834; H01L 21/76897; H01L 21/76811; H01L 23/485; H01L 27/0886; H01L 29/41791; H01L 29/7851; H01L 29/66795; H01L 29/7848; H01L 29/785
  See application file for complete search history.

(56) References Cited

U.S. PATENT DOCUMENTS

| | | |
|---|---|---|
| 9,508,818 B1 | 11/2016 | Basker et al. |
| 9,548,366 B1 | 1/2017 | Ho et al. |
| 9,570,450 B1 | 2/2017 | Basker et al. |
| 9,640,625 B2 | 5/2017 | Bouche et al. |
| 9,685,340 B2 | 6/2017 | Ok et al. |
| 10,043,800 B2 | 8/2018 | Kim et al. |
| 10,083,863 B1 * | 9/2018 | Hsieh ................ H01L 21/76805 |
| 10,096,688 B2 | 10/2018 | Tak et al. |
| 2016/0005822 A1 | 1/2016 | Song et al. |
| 2016/0336183 A1 | 11/2016 | Yuan et al. |
| 2017/0040318 A1 | 2/2017 | Hung et al. |
| 2017/0092585 A1 | 3/2017 | Fan et al. |
| 2017/0125283 A1 | 5/2017 | Lee et al. |
| 2017/0309714 A1 | 10/2017 | Xie et al. |
| 2017/0373161 A1 | 12/2017 | Schroeder |
| 2018/0012798 A1 | 1/2018 | Labonte et al. |
| 2018/0096934 A1 | 4/2018 | Siew et al. |
| 2018/0096935 A1 | 4/2018 | Kim et al. |

FOREIGN PATENT DOCUMENTS

| | | |
|---|---|---|
| CN | 107871739 A | 4/2018 |
| CN | 107919357 A | 4/2018 |
| CN | 107919358 A | 4/2018 |

* cited by examiner

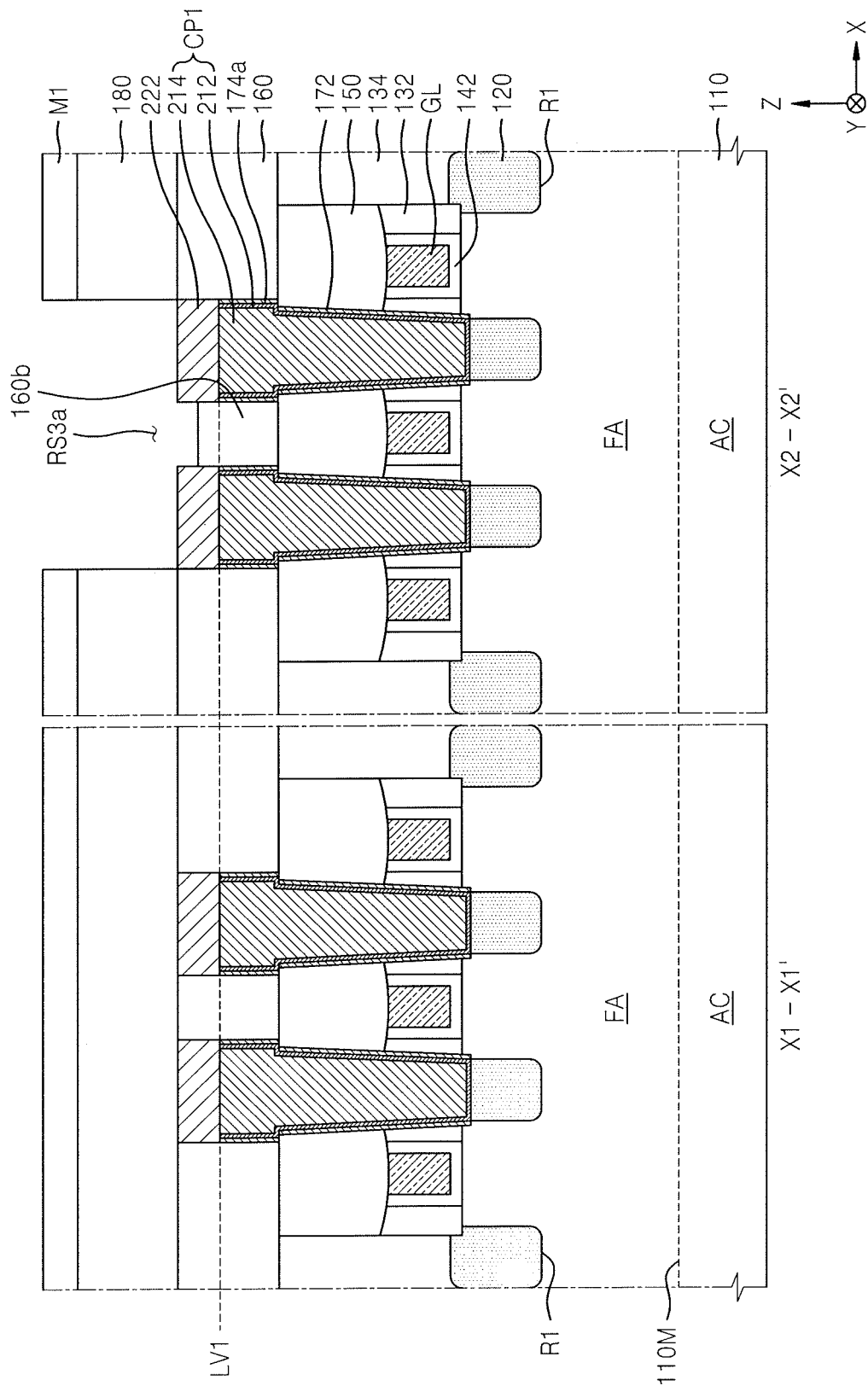

METHOD OF MANUFACTURING AN INTEGRATED CIRCUIT DEVICE INCLUDING A FIN-TYPE ACTIVE REGION

CROSS-REFERENCE TO RELATED APPLICATIONS

This is a continuation application based on pending application Ser. No. 16/404,857, filed May 7, 2019. the entire contents of which is hereby incorporated by reference.

Korean Patent Application No. 10-2018-0087280, filed on Jul. 26, 2018, in the Korean Intellectual Property Office, and entitled: "Integrated Circuit Device," is incorporated by reference herein in its entirety.

BACKGROUND

1. Field

Embodiments relate to an integrated circuit device.

2. Description of the Related Art

As electronic technology has been developed, integrated circuit devices have been rapidly down-scaled.

SUMMARY

The embodiments may be realized by providing an integrated circuit device including a substrate having a device active region; a fin-type active region protruding from the substrate on the device active region; a gate line intersecting the fin-type active region and covering a top surface and both side walls of the fin-type active region; a gate insulating capping layer covering a top surface of the gate line; source/drain regions at sides of the gate line on the fin-type active region; a pair of first conductive plugs respectively connected to the source/drain regions; a hard mask layer covering a top surface of each first conductive plug of the pair of first conductive plugs; and a second conductive plug between the first conductive plugs of the pair of first conductive plugs, the second conductive plug being connected to the gate line by passing through the gate insulating capping layer and having a top surface at a level that is higher than a level of the top surface of each first conductive plug of the pair of first conductive plugs, wherein the hard mask layer protrudes from the top surface of each first conductive plug of the pair of first conductive plugs and toward the second conductive plug so that a portion of the hard mask layer overhangs from an edge of the top surface of each first conductive plug of the pair of first conductive plugs.

The embodiments may be realized by providing an integrated circuit device including a substrate having a device active region; a fin-type active region protruding from the substrate on the device active region; a gate line intersecting the fin-type active region and covering a top surface and both side walls of the fin-type active region; source/drain regions at sides of the gate line on the fin-type active region; a pair of first conductive plugs respectively connected to the source/drain regions; a hard mask layer including a cover mask layer covering a top surface of each first conductive plug of the pair of first conductive plugs and a cover spacer covering a side surface of the cover mask layer and overhanging from an edge of the top surface of each first conductive plug of the pair of first conductive plugs; a second conductive plug between the first conductive plugs of the pair of first conductive plugs, the second conductive plug being connected to the gate line and having a top surface at a level that is higher than a level of the top surface of each first conductive plug of the pair of first conductive plugs; wherein the hard mask layer protrudes toward the second conductive plug, and a side wall insulating capping layer under the cover spacer and between the pair of first conductive plugs and the second conductive plug.

The embodiments may be realized by providing an integrated circuit device including a substrate having a device active region; a fin-type active region protruding from the substrate on the device active region; a gate line intersecting the fin-type active region and covering a top surface and both side walls of the fin-type active region; source/drain regions at sides of the gate line on the fin-type active region; a pair of first conductive plugs respectively connected to the source/drain regions; a pair of hard mask layers respectively covering top surfaces of the pair of first conductive plugs and protruding from the top surfaces of the pair of first conductive plugs; a second conductive plug between the first conductive plugs of the pair of first conductive plugs and the pair of hard mask layers covering the pair of first conductive plugs and connected to the gate line, wherein the pair of hard mask layers protrude toward the second conductive plug; and via contacts passing through the pair of hard mask layers and connected to the pair of first conductive plugs.

BRIEF DESCRIPTION OF THE DRAWINGS

Features will be apparent to those of skill in the art by describing in detail exemplary embodiments with reference to the attached drawings in which:

FIG. 5A illustrates a cross-sectional view of a stage in a method of manufacturing an integrated circuit device, according to an embodiment;

DETAILED DESCRIPTION

Figure 1:
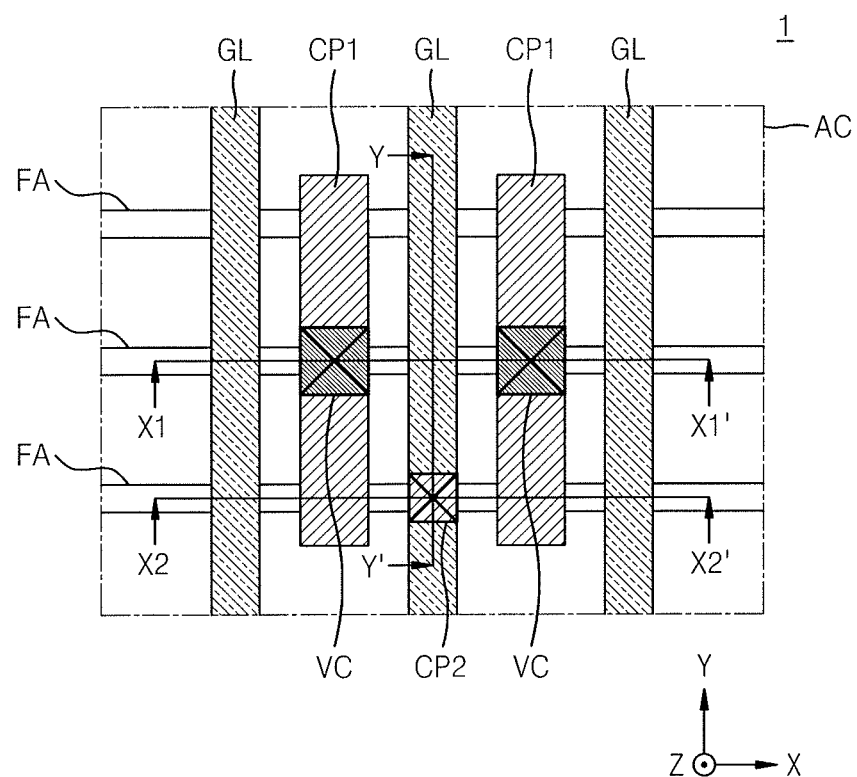
FIG. 1 illustrates a planar layout diagram of an integrated circuit device according to embodiments.

FIG. 1 illustrates a planar layout diagram of an integrated circuit device 1 according to embodiments.

Referring to FIG. 1, the integrated circuit device 1 may include a fin field-effect transistor (FinFET) device. The FinFET device may constitute a logic cell. The logic cell may be configured in various ways to include a plurality of circuit elements such as a transistor and a register. The logic cell may constitute, e.g., an AND, a NAND, an OR, a NOR, an XOR (exclusive OR), an XNOR (exclusive NOR), an INV (inverter), an ADD (adder), a BUF (buffer), a DLY (delay), an FIL (filter), a multiplexer (MXT/MXIT), an OAI (OR/AND/INVERTER), an AO (AND/OR), an AOI (AND/OR/INVERTER), a D flip-flop, a reset flip-flop, (master-slaver flip-flop), and a latch, and may constitute a standard cell for performing a desired logic function such as a counter or a buffer.

In the integrated circuit device 1, a plurality of fin-type active regions FA may protrude in a device active region AC. The plurality of fin-type active regions FA may extend parallel to one another in a first direction (e.g., an X direction).

A plurality of gate lines GL may extend in a second direction (e.g., a Y direction) intersecting the plurality of fin-type active regions FA.

A plurality of MOS transistors may be formed along the plurality of gate lines GL on the device active region AC. The plurality of MOS transistors may be MOS transistors having a three-dimensional (3D) structure in which channels are formed on a top surface and both side walls of each of the plurality of fin-type active regions FA.

A plurality of first conductive plugs CP1 may be formed on the plurality of fin-type active regions FA. The plurality of first conductive plugs CP1 may extend to cross the plurality of fin-type active regions FA. For example, the plurality of first conductive plugs CP1 may extend in the second direction (e.g., the Y direction). The plurality of first conductive plugs CP1 may be connected to a plurality of source/drain regions 120 (see FIG. 2A). In FIG. 1, the first conductive plugs CP1 are formed on three fin-type active regions FA to cross the three fin-type active regions FA in the Y direction.

The integrated circuit device 1 may include a plurality of via contacts VC that are conductive and are connected to the plurality of first conductive plugs CP1.

The integrated circuit device 1 may include a second conductive plug CP2 connected to at least one of the plurality of gate lines GL. In an implementation, the second conductive plug CP2 may be connected to one gate line GL from among the plurality of gate lines GL in FIG. 1. In an implementation, the second conductive plugs CP2 may be connected to remaining gate lines GL from among the plurality of gate lines GL.

The plurality of first conductive plugs CP1 and the second conductive plug CP2 may be located in the device active region AC. The second conductive plug CP2 may be located between one pair of first conductive plugs CP1.

Figure 2A:
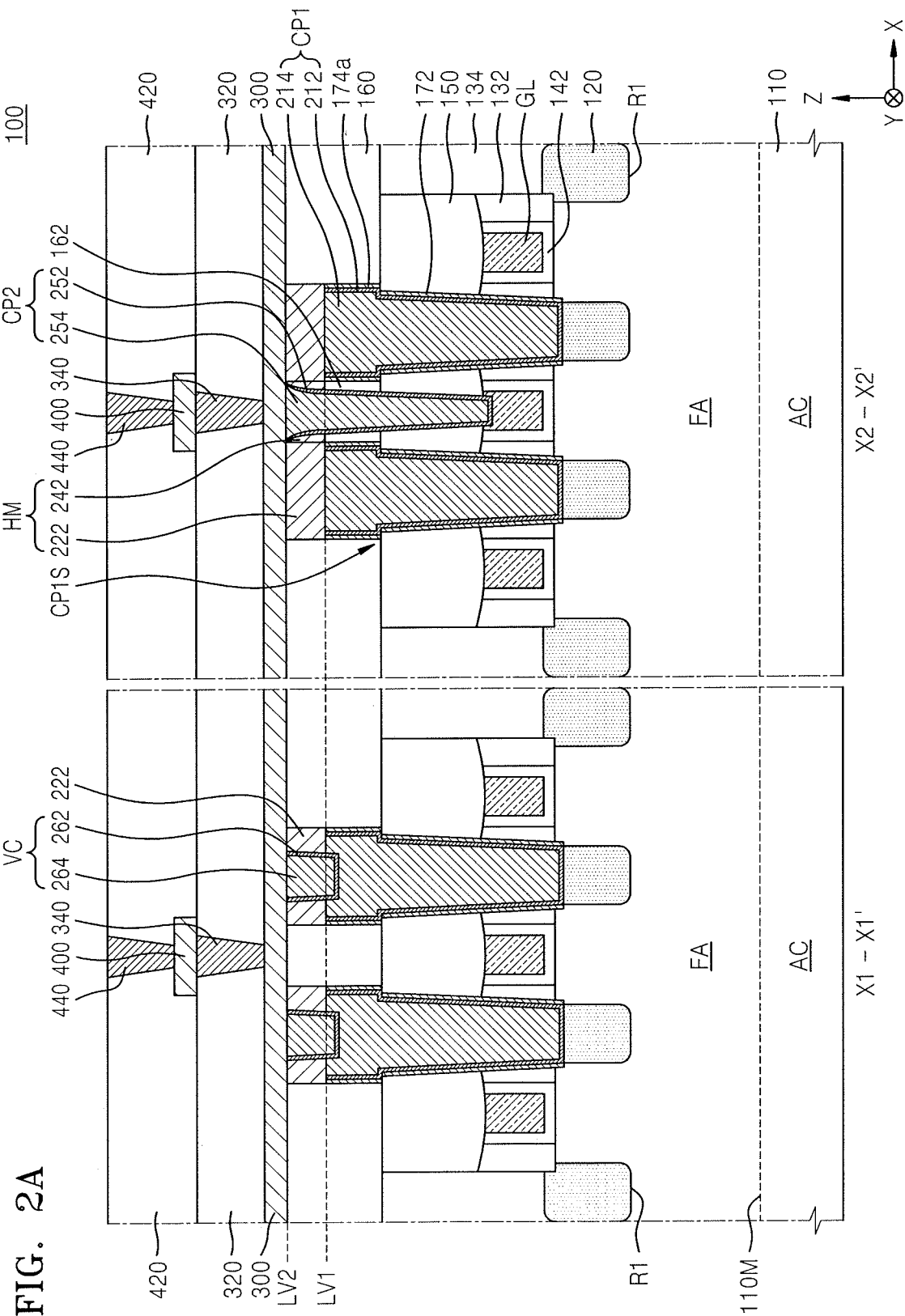
FIGS. 2A and 2B illustrate cross-sectional views of an integrated circuit device according to an embodiment.
Figure 2B:
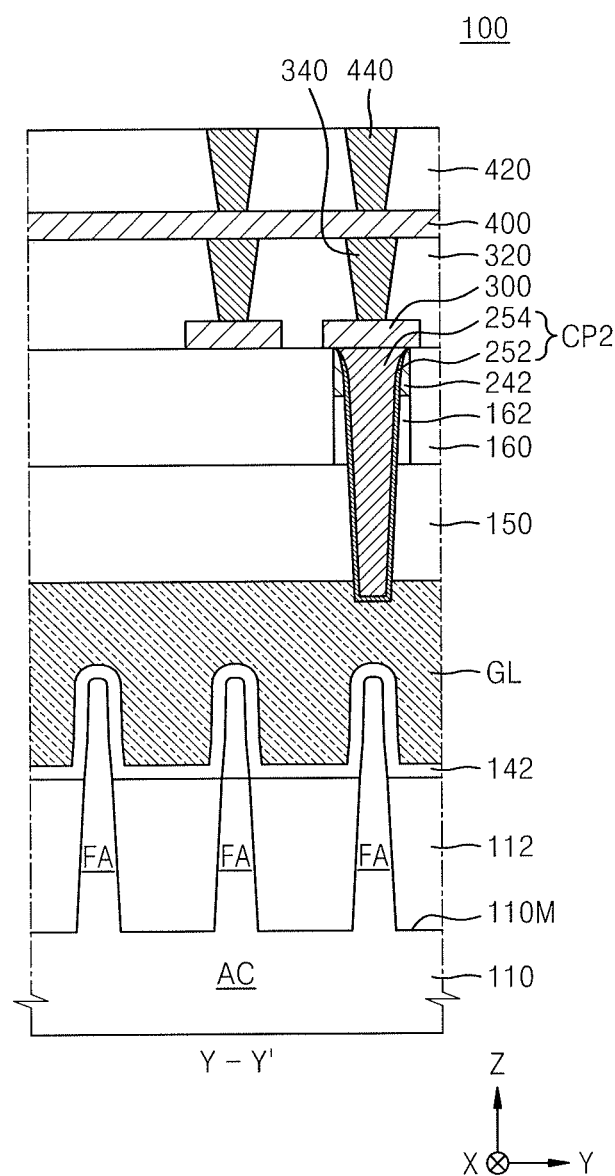

FIGS. 2A and 2B illustrate cross-sectional views of an integrated circuit device 100 according to an embodiment. For example, FIG. 2A illustrates a cross-sectional view of the integrated circuit device 100 taken along lines X1-X1' and X2-X2' of FIG. 1. FIG. 2B illustrates a cross-sectional view of the integrated circuit device 100 taken along line Y-Y' of FIG. 1.

Referring to FIGS. 2A and 2B, the integrated circuit device 100 may include a substrate 110 having the device active region AC, and the plurality of fin-type active regions FA protruding from the substrate 110 in the device active region AC. The substrate 110 may have a main surface 110M extending in a horizontal direction (e.g., an X-Y planar direction). The substrate 110 may include a semiconductor such as silicon (Si) or germanium (Ge) or a compound semiconductor such as SiGe, SiC, GaAs, or InP. The substrate 110 may include a conductive region, e.g., an impurity-doped well or an impurity-doped structure.

The plurality of fin-type active regions FA may extend parallel to one another in the first direction (e.g., the X direction). A device isolation film 112 may be formed between the fin-type active regions FA on the device active region AC. The plurality of fin-type active regions FA may upwardly protrude beyond (e.g., above) the device isolation film 112 to have fin shapes.

The device isolation film 112 may be, e.g., a silicon oxide film. In an implementation, the device isolation film 112 may include a first insulating liner, a second insulating liner, and a buried insulating film sequentially stacked on the substrate 110.

A plurality of gate lines GL may be located on the substrate 110 and may extend in the second direction (e.g., the Y direction) that intersects the plurality of fin-type active regions FA. The plurality of gate lines GL may have the same width in the first direction (e.g., the X direction) and may be arranged at constant pitches in the first direction (e.g., the X direction). Gate insulating films 142 may be located between the plurality of gate lines GL and the plurality of fin-type active regions FA. Each of the gate insulating films 142 may cover a bottom surface and both side walls of each of the plurality of gate lines GL.

The plurality of gate lines GL may cover top surfaces and both side walls of the plurality of fin-type active regions FA and a top surface of the device isolation film 112. A plurality of MOS transistors may be formed along a plurality of gate lines GL in the device active region AC. The plurality of MOS transistors may be MOS transistors having a 3D structure in which channels are formed on the top surface and both side walls of each of the plurality of fin-type active regions FA.

The plurality of gate insulating films 142 may include a silicon oxide film, a high-k film, or a combination thereof. The high-k film may be formed of a material having a dielectric constant that is higher than that of a silicon oxide film. For example, the plurality of gate insulating films 142 may have a dielectric constant ranging from about 10 to about 25. The high-k film may be formed of metal oxide or metal oxynitride. In an implementation, the high-k film may be formed of, e.g., hafnium oxide, hafnium oxynitride, hafnium silicon oxide, lanthanum oxide, lanthanum aluminum oxide, zirconium oxide, zirconium silicon oxide, tantalum oxide, titanium oxide, or a combination thereof. An interface film may be located between the fin-type active region FA and the gate insulating films 142. The interface film may include an oxide film, a nitride film, or an oxynitride film.

The plurality of gate lines GL may have a structure in which a metal nitride layer, a metal layer, a conductive capping layer, and a gap-fill metal film are sequentially stacked. The metal nitride layer and the metal layer may include at least one metal, e.g., titanium (Ti), tantalum (Ta), tungsten (W), ruthenium (Ru), niobium (Nb), molybdenum (Mo), or hafnium (Hf). The gap-fill metal film may include a tungsten (W) film or an aluminum (Al) film. Each of the plurality of gate lines GL may include a work function metal-containing layer. The work function metal-containing layer may include at least one metal, e.g., titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er), or palladium (Pd). In an implementation, each of the plurality of gate lines GL may include, e.g., a TiAlC/TiN/W stacked structure, a TiN/TaN/TiAlC/TiN/W stacked structure, or a TiN/TaN/TiN/TiAlC/TiN/W stacked structure.

Gate insulating spacers 132 may be located on both side walls of each of the plurality of gate lines GL. The gate insulating spacers 132 may cover both side walls of each of the plurality of gate lines GL. The gate insulating spacers 132 may extend parallel to the gate lines GL in the second direction (e.g., the Y direction) that is a longitudinal direction of the gate lines GL. The gate insulating spacers 132 may include a silicon nitride film, a SiOCN film, a SiCN film, or a combination thereof. In an implementation, the plurality of gate insulating spacers 132 may include a material film, e.g., a SiOCN film, a SiCN film, or a combination thereof, having a dielectric constant that is lower than that of a silicon nitride film. In an implementation, the gate insulating films 142 may be located between the gate lines GL and the gate insulating spacers 132 and may extend in a third direction (e.g., a Z direction) that is perpendicular to the main surface 110M of the substrate 110.

A top surface of each of the plurality of gate lines GL may be covered by a gate insulating capping layer 150. A plurality of the gate insulating capping layers 150 may include a silicon nitride film. The plurality of gate insulating capping layers 150 may perpendicularly overlap the gate lines GL and the gate insulating spacers 132 and extend parallel to the gate lines GL.

One pair of source/drain regions 120 may be formed at both sides of each of the plurality of gate lines GL on the plurality of fin-type active regions FA. The gate line GL and the source/drain regions 120 may be spaced apart from each other with the gate insulating film 142 and the gate insulating spacers 132 therebetween. The plurality of source/drain regions 120 may include an impurity ion-implanted region formed in a part of the fin-type active region FA, a semiconductor epitaxial layer epitaxially grown from a plurality of recess regions R1 formed in the fin-type active region FA, or a combination thereof. The plurality of source/drain regions 120 may include a Si layer that is epitaxially grown, a SiC layer that is epitaxially grown, or a plurality of SiGe layers that are epitaxially grown. When a transistor formed on the plurality of fin-type active regions FA is an NMOS transistor, the plurality of source/drain regions 120 may include a Si layer that is epitaxially grown or a SiC layer that is epitaxially grown, and may include N-type impurities. When a transistor formed on the plurality of fin-type active regions FA is a PMOS transistor, the plurality of source/drain regions 120 may include a SiGe layer that is epitaxially grown and may include P-type impurities.

Some of the plurality of source/drain regions 120 may be covered by an inter-gate insulating film 134. The inter-gate insulating film 134 may include a silicon oxide film.

An upper insulating layer 160 may cover the inter-gate insulating film 134 and the gate insulating capping layer 150. The upper insulating layer 160 may include a silicon oxide film. For example, the upper insulating layer 160 may include a tetraethyl orthosilicate (TEOS) film or an ultra low-k (ULK) film having an ultra low dielectric constant ranging from about 2.2 to about 2.4. The ULK film may include a SiOC film or a SiCOH film.

The plurality of first conductive plugs CP1 connected to the plurality of source/drain regions 120 may be formed on the plurality of fin-type active regions FA. The plurality of first conductive plugs CP1 may extend to cross the plurality of fin-type active regions FA. Each of the plurality of first conductive plugs CP1 may include a first conductive barrier layer 212 and a first conductive core layer 214. The first conductive barrier layer 212 may cover a side surface and a bottom surface of the first conductive core layer 214 to surround the first conductive core layer 214. In an implementation, the first conductive barrier layer 212 may be formed of, e.g., Ti, Ta, TiN, TaN, or a combination thereof, and the first conductive core layer 214 may be formed of, e.g., Co, W, or a combination thereof.

In an implementation, a silicide layer may be located between the first conductive barrier layer 212 and each of the source/drain regions 120. The silicide layer may include, e.g., tungsten silicide (WSi), titanium silicide (TiSi), cobalt silicide (CoSi), or nickel silicide (NiSi).

A first level LV1 that is a level of a top surface of each of the first conductive plugs CP1 on the first fin-type active region FA may be higher than a level of a top surface of each of the gate lines GL and may be lower than a second level LV2 that is a level of a top surface of the upper insulating layer 160. For example, the level may refer to a distance from the main surface 110M of the substrate 110. For example, when a surface is described as being at a same level as another surface, the surfaces may be coplanar.

In an implementation, each of the plurality of first conductive plugs CP1 may have a stepped portion CP1S at an interface between the upper insulating layer 160 and the gate insulating capping layer 150 so that a width of a portion of the first conductive plug CP1 in the upper insulating layer 160 is greater than a width of a portion of the first conductive plug CP1 in the gate insulating capping layer 150.

In an implementation, a first side cover layer 172 and a second side cover layer 174a may cover a side surface of the first conductive plug CP1. The first side cover layer 172 may cover a side surface of a lower portion of the first conductive plug CP1 from a level of a bottom surface of the first conductive plug CP1 to a level of a top surface of the gate insulating capping layer 150. The second side cover layer 174a may cover a side surface of an upper portion of the first conductive plug CP1 from a level of a bottom surface of the upper insulating layer 160 to a level of a top surface thereof. For example, the first side cover layer 172 may be located between the first conductive plug CP1, the gate insulating spacers 132, and the gate insulating capping layer 150, and the second side cover layer 174a may be located between the first conductive plug CP1 and the upper insulating layer 160. A level of an uppermost end of the second side cover layer 174a may be at the first level LV1 (that is the level of the top surface of the first conductive plug CP1). In an implementation, the first side cover layer 172 and the second side cover layer 174a may be spaced apart from each other.

A hard mask layer HM may be located on the first conductive plug CP1. The hard mask layer HM may protrude or extend (e.g., upwardly) from the top surface of the first conductive plug CP1 and (e.g., laterally) toward the second conductive plug CP2. For example, a portion of the hard mask layer HM may overhang from the top surface of the first conductive plug CP1 (e.g., may extend laterally outwardly beyond an outer edge of the first conductive plug CP1). The hard mask layer HM may include a cover mask layer 222 covering the top surface of the first conductive plug CP1 and a cover spacer 242 covering a side surface of the cover mask layer 222. The cover mask layer 222 may cover top surfaces of the first conductive plug CP1 and the second side cover layer 174a, and the cover spacer 242 may not overlap the first conductive plug CP1 and the second side cover layer 174a in the third direction (e.g., the Z direction) perpendicular to the main surface 110M of the substrate 110. For example, the cover spacer 242 may be a portion of the hard mask layer HM that laterally protrudes (e.g., from the top surface of the first conductive plug CP1) toward the second conductive plug CP2 and overhangs from the top surface of the first conductive plug CP1.

A level of a top surface of the hard mask layer HM may be at the second level LV2 (that is a level of the top surface of the upper insulating layer 160).

The hard mask layer HM may be formed of an insulating material having an etch selectivity with respect to oxide and nitride. The hard mask layer HM may be formed of a silicon carbide-based material (e.g., a silicon carbide material). For example, the hard mask layer HM may be formed of SiC, SiOCN, SiCN, or a combination thereof. In an implementation, the hard mask layer HM may be formed of a doped silicon carbide material. For example, the hard mask layer HM may include a doped SiOCN film, a doped SiCN film, or a combination thereof. For example, the hard mask layer HM may include boron (B), silicon (Si), carbon (C), nitrogen (N), arsenic (As), phosphorus (P), oxygen (O), fluorine (F), argon (Ar), germanium (Ge), hydrogen (H), or helium (He) as a dopant.

The cover mask layer 222 and the cover spacer 242 may be formed of the same material, e.g., silicon carbide materials having the same carbon content. In an implementation, the cover mask layer 222 and the cover spacer 242 may be formed of silicon carbide materials having different carbon contents.

The integrated circuit device 100 may include the via contact VC that passes through the hard mask layer HM and is connected to the first conductive plug CP1. The via contact VC may include a conductive via barrier layer 262 and a conductive via core layer 264. The conductive via barrier layer 262 may cover a side surface and a bottom surface of the conductive via core layer 264 to surround the conductive via core layer 264. The conductive via barrier layer 262 may be formed of Ti, Ta, TiN, TaN, or a combination thereof, and the conductive via core layer 264 may be formed of W or Cu.

In an implementation, a level of a top surface of the via contact VC may be at the second level LV2 (that is a level of the top surface of the hard mask layer HM). In an implementation, when the via contact VC is formed by using a dual damascene process, the via contact VC may be integrally formed with a wiring line located on the upper insulating layer 160, and a level of a bottom surface of the wiring line may be the second level LV2.

The integrated circuit device 100 may include the second conductive plug CP2 connected to at least one of the plurality of gate lines GL. The second conductive plug CP2 may include a second conductive barrier layer 252 and a second conductive core layer 254. The second conductive barrier layer 252 may cover a side surface and a bottom surface of the second conductive core layer 254 to surround the second conductive core layer 254. In an implementation, the second conductive barrier layer 252 may be formed of, e.g., Ti, Ta, TiN, TaN, or a combination thereof, and the second conductive core layer 254 may be formed of, e.g., Co, W, or a combination thereof. The second conductive plug CP2 may pass through the upper insulating layer 160 and the gate insulating capping layer 150 and may contact the gate line GL. A level of a top surface of the second conductive plug CP2 may be higher (e.g., farther from the main surface 110M of the substrate 110) than the first level LV1 (that is a level of the top surface of each of the plurality of first conductive plugs CP1). A level of the top surface of the second conductive plug CP2 may be at the second level LV2 (that is a level of the top surface of the upper insulating layer 160). A level of the top surface of the second conductive plug CP2 may be the same as a level of the top surface of the hard mask layer HM.

A first wiring 300 and a second wiring 400 may be located on the second conductive plug CP2 and the via contact VC. In an implementation, the first wiring 300 and the second wiring 400 may extend in different horizontal directions (e.g., the X-Y planar direction). For example, the first wiring 300 and the second wiring 400 may perpendicularly intersect each other and may extend in the horizontal direction (e.g., the X-Y planar direction). The first wiring 300 may be connected to the second conductive plug CP2 and the via contact VC. In an implementation, the second conductive plug CP2 and the via contact VC may be electrically connected to, e.g., different first wirings 300. In an implementation, the first wiring 300 may electrically connect the second conductive plug CP2 and the via contact VC.

The first wiring 300 and the second wiring 400 may be connected to each other by a first inter-wiring plug 340 that passes through a first inter-wiring insulating layer 320 covering the first wiring 300. In an implementation, the first inter-wiring insulating layer 320 may contact a bottom surface of the second wiring 400 and does not contact a side surface of the second wiring 400, as illustrated in FIGS. 2A and 2B. In an implementation, the first inter-wiring insulating layer 320 may contact both the bottom surface and the side surface of the second wiring 400.

The second wiring 400 may be connected to a second inter-wiring plug 440 that passes through a second inter-wiring insulating layer 420 covering the second wiring 400. The second inter-wiring plug 440 may electrically connect the second wiring 400 and a wiring or a conductive layer located on the second wiring 400.

A side wall of the second conductive plug CP2 may be covered by the cover spacer 242 of the hard mask layer HM, the upper insulating layer 160, a side wall insulating capping layer 162, and the gate insulating capping layer 150. The gate insulating capping layer 150 may cover a side surface of a lower portion of the second conductive plug CP2 (e.g., downward from or below a level of the top surface of the gate insulating capping layer 150). The side wall insulating capping layer 162 and the cover spacer 242 may cover a side surface of an upper portion of the second conductive plug CP2 from a level of the bottom surface of the upper insulating layer 160 to a level of the top surface of the upper insulating layer 160.

The side wall insulating capping layer 162 may be located under (e.g., closer to the substrate 110 than) the cover spacer 242 and may cover a portion of the side surface of the upper portion of each of the plurality of first conductive plugs CP1. The side wall insulating capping layer 162 may be formed of, e.g., silicon oxide. The side wall insulating capping layer 162 may be formed of the same material as that of the upper insulating layer 160. The side wall insulating capping layer 162 may be a portion of the upper insulating layer 160. A top surface of the side wall insulating capping layer 162 may be covered by the cover spacer 242.

The second conductive plug CP2 may be formed by using a self-aligned contact (SAC) process using the hard mask layer HM. The side wall insulating capping layer 162 may be formed when a portion 160a (see FIG. 3L) of the upper insulating layer 160 that is covered by the cover spacer 242 remains without being removed during an SAC process of forming the second conductive plug CP2 (see FIGS. 3L through 3N).

The second level LV2 (that is a level of the top surface of the second conductive plug CP2) may be higher than the first level LV1 (that is a level of the top surface of each of the plurality of first conductive plugs CP1) on the fin-type active region FA, and the hard mask layer HM may be located on the first conductive plug CP1. The hard mask layer HM may include the cover spacer 242 protruding laterally toward the second conductive plug CP2 so as not to overlap the first conductive plug CP1 in the third direction (e.g., the Z direction) and overhanging from the top surface of the first conductive plug CP1, and the side surface of the upper portion of the second conductive plug CP2 that is higher than the first level LV1 that is a level of the top surface of the first conductive plug CP1 may be covered by the cover spacer 242. Also, the side wall insulating capping layer 162 may be between the first conductive plug CP1 and the second conductive plug CP2 and between the top surface of the gate insulating capping layer 150 and a bottom surface of the cover spacer 242.

For example, the side wall insulating capping layer 162 may be formed by the cover spacer 242, and an insulating distance in the horizontal direction (e.g., the X-Y planar direction) between the first conductive plug CP1 and the second conductive plug CP2 may be secured. Also, the second conductive plug CP2 may be formed by using an SAC process using the hard mask layer HM including the cover spacer 242, and undesired misalignment during an etching process for forming the second conductive plug CP2 may be prevented.

Figure 3A:
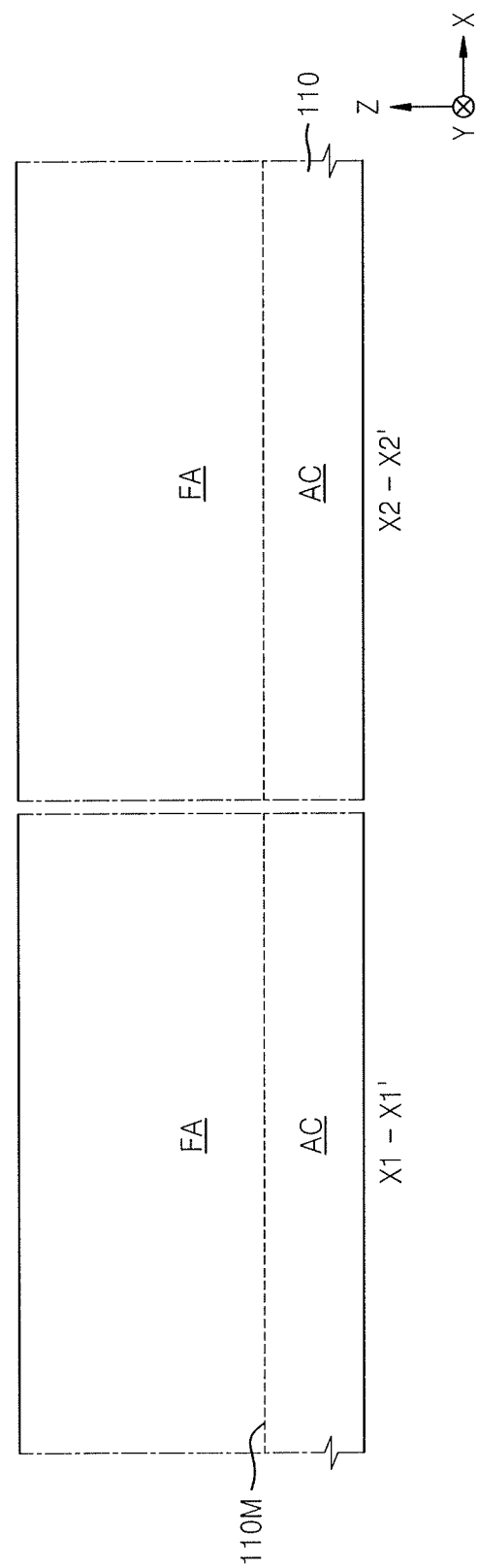
FIGS. 3A through 3Q illustrate cross-sectional views of stages in a method of manufacturing an integrated circuit device in a process order, according to an embodiment.
Figure 3B:
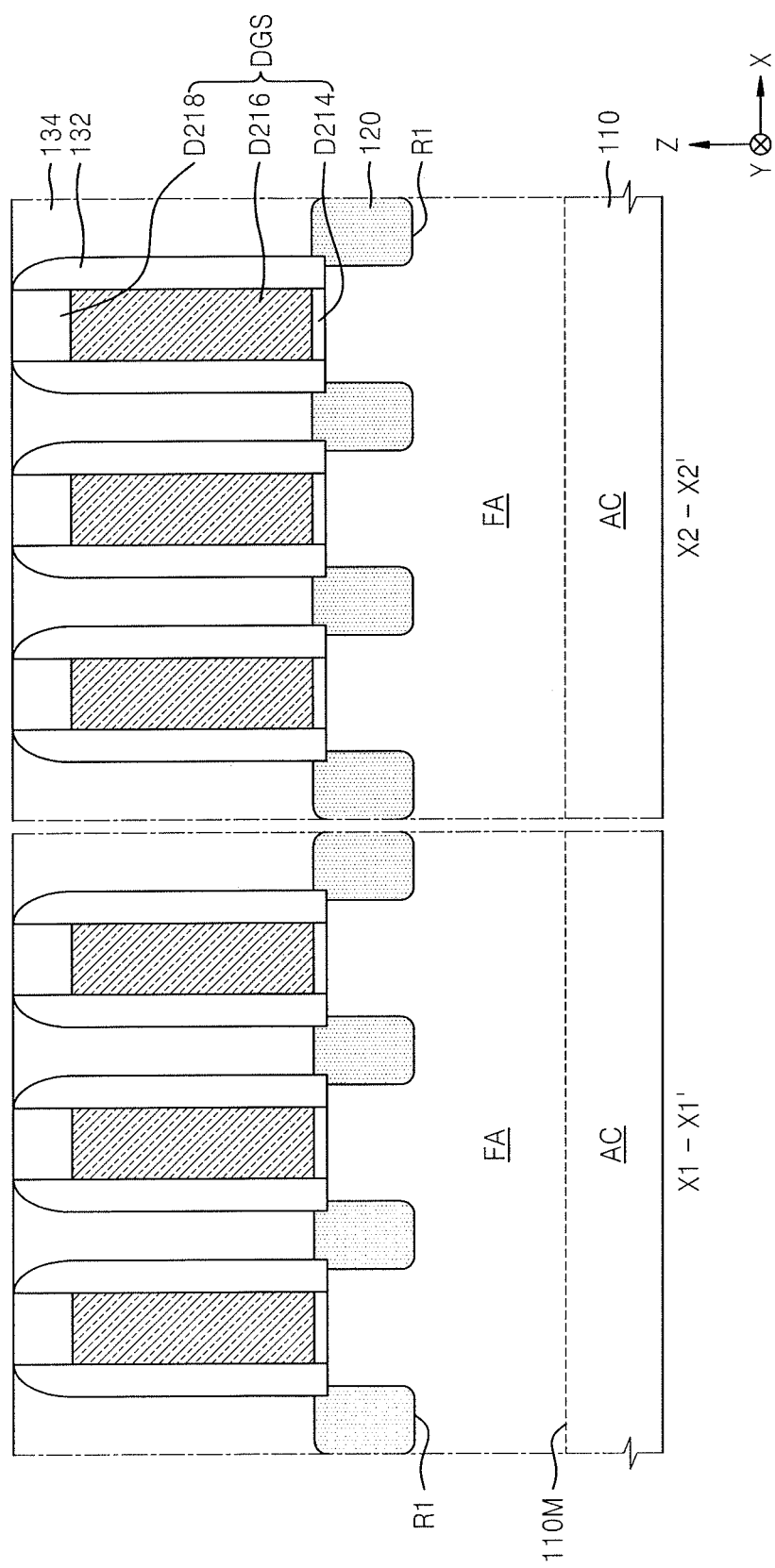
Figure 3C:
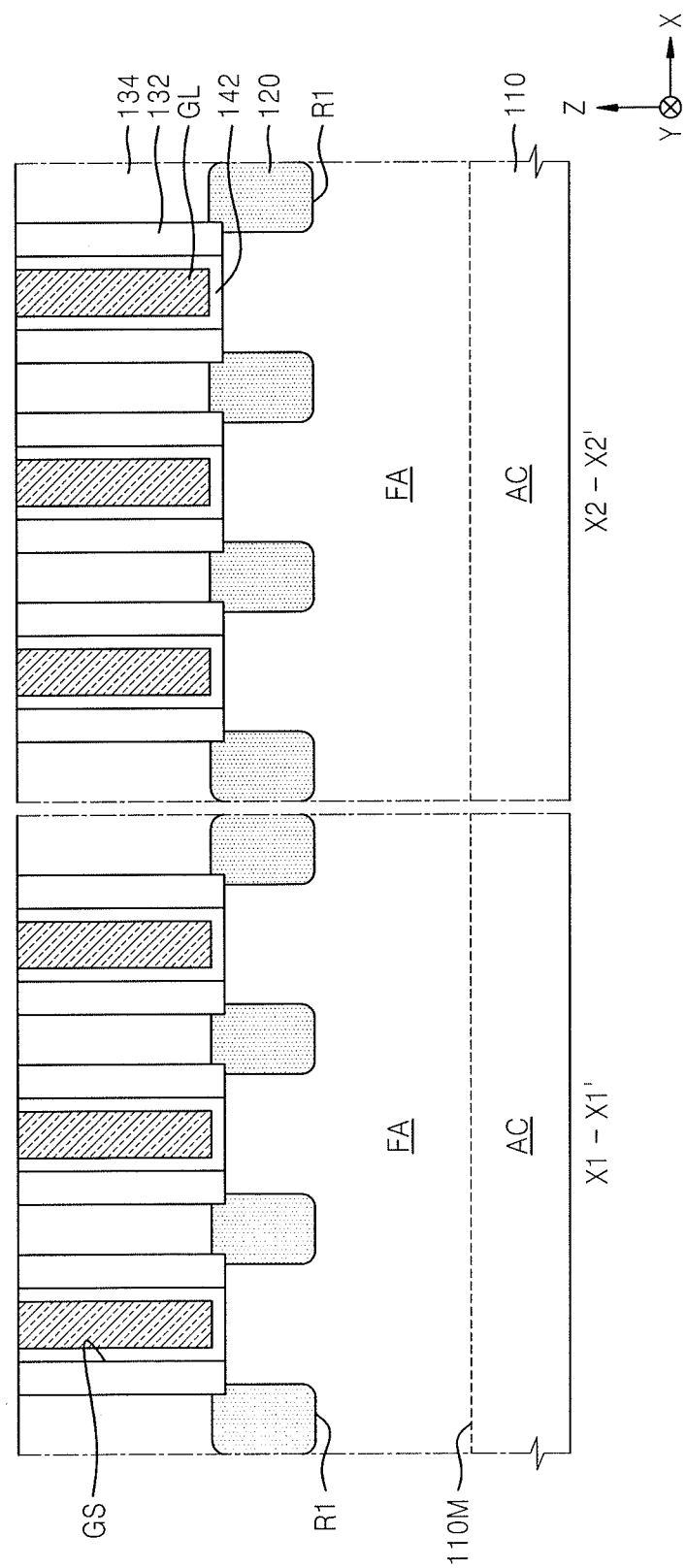
Figure 3D:
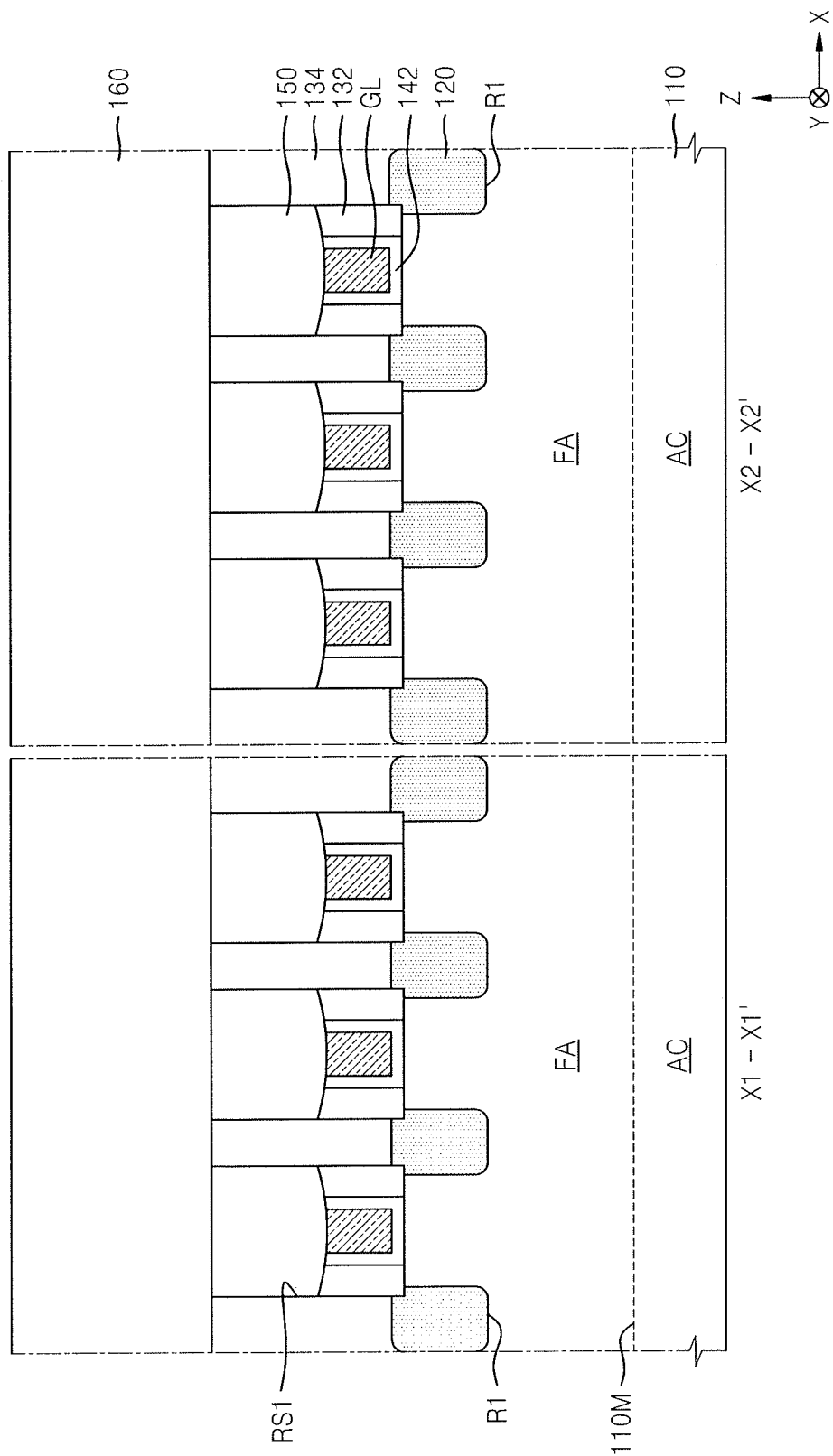
Figure 3E:
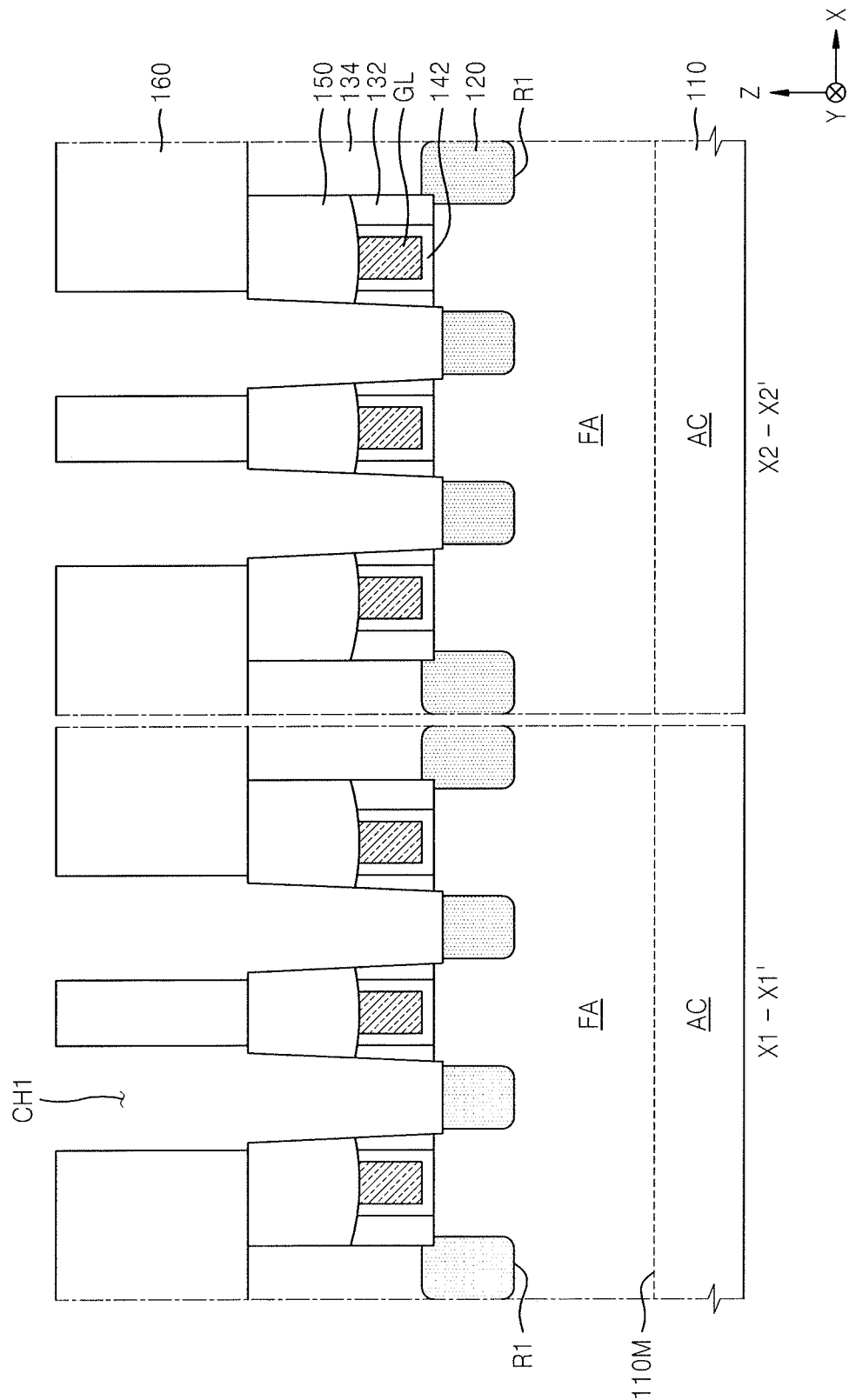
Figure 3F:
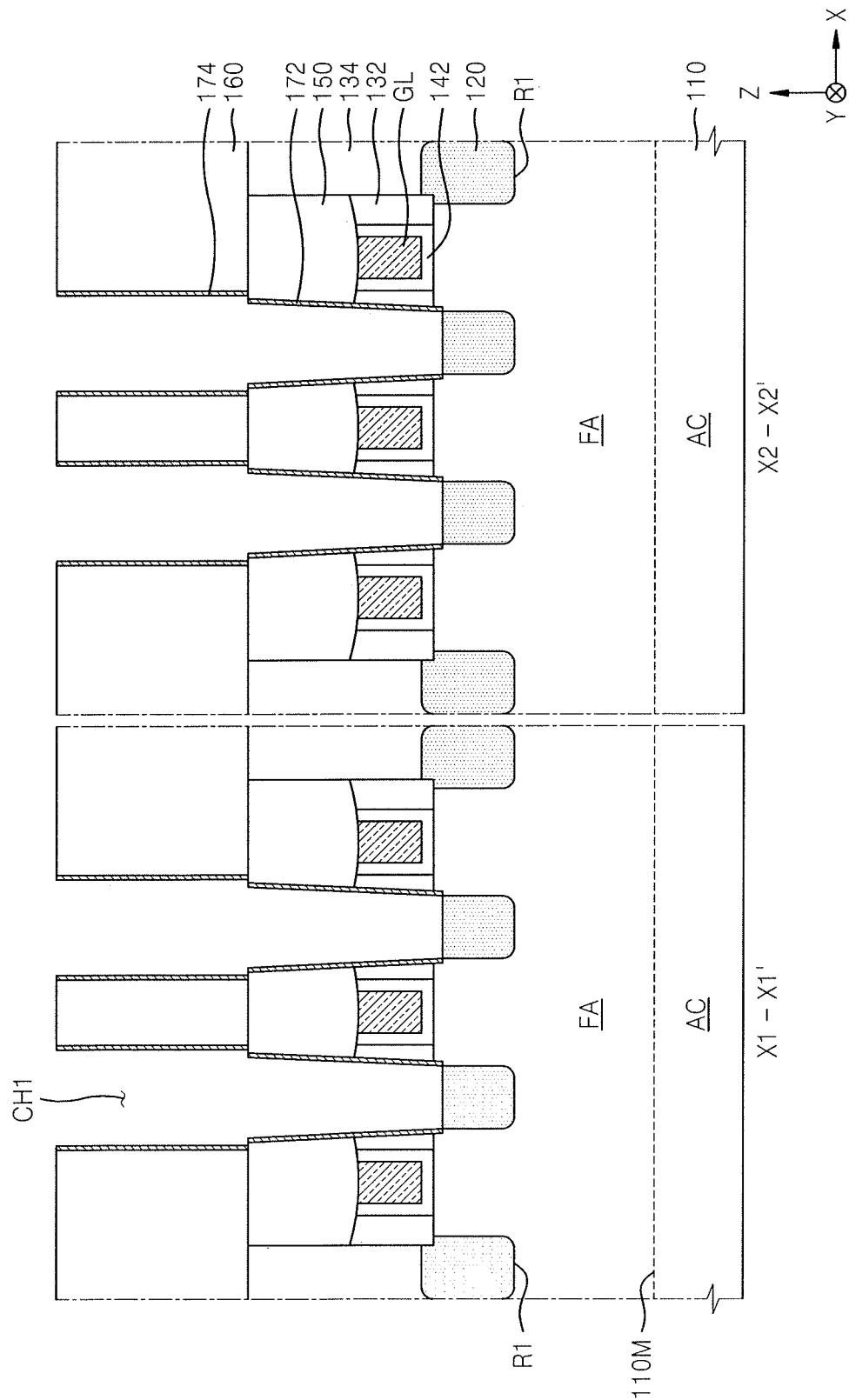
Figure 3G:
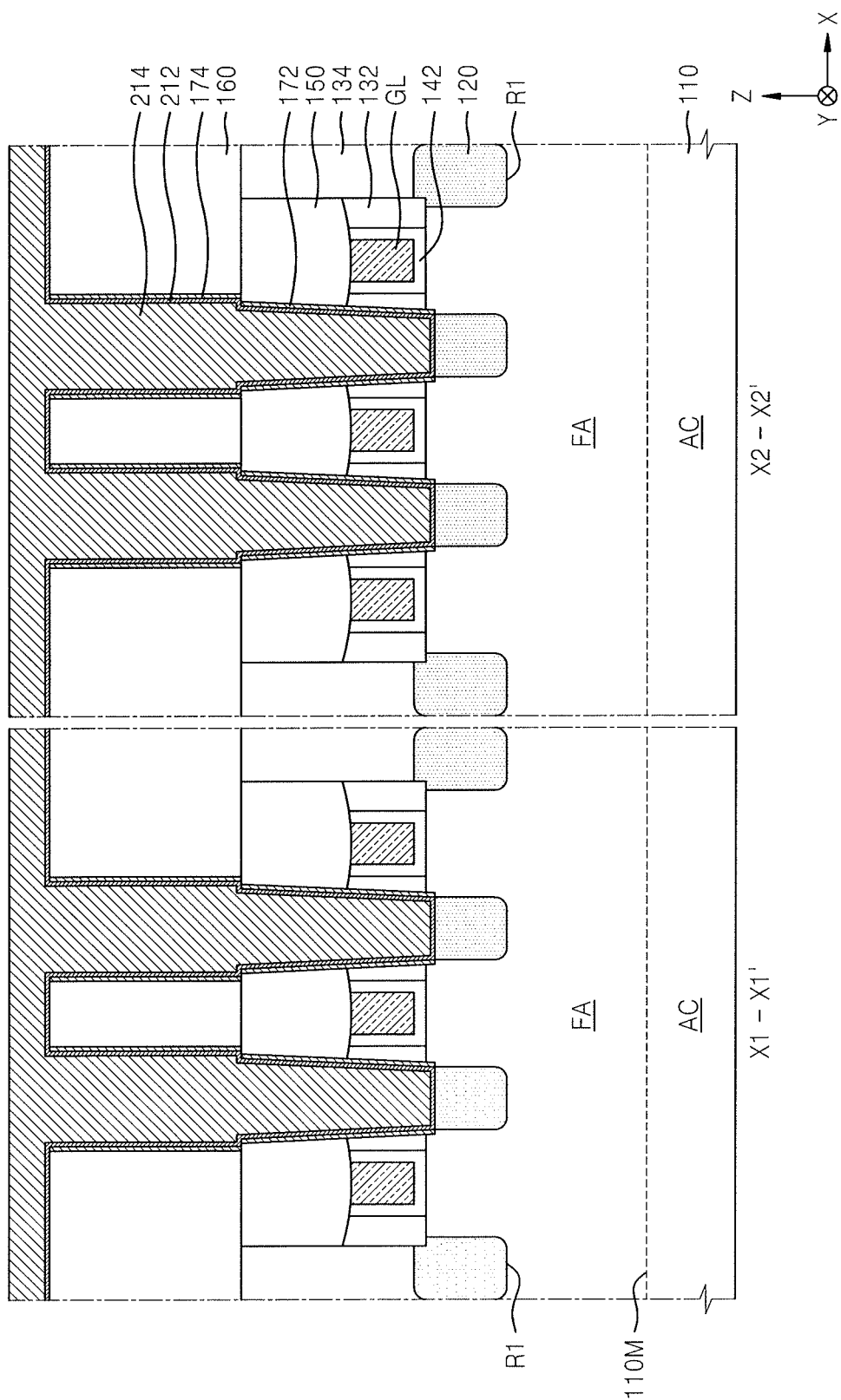
Figure 3H:
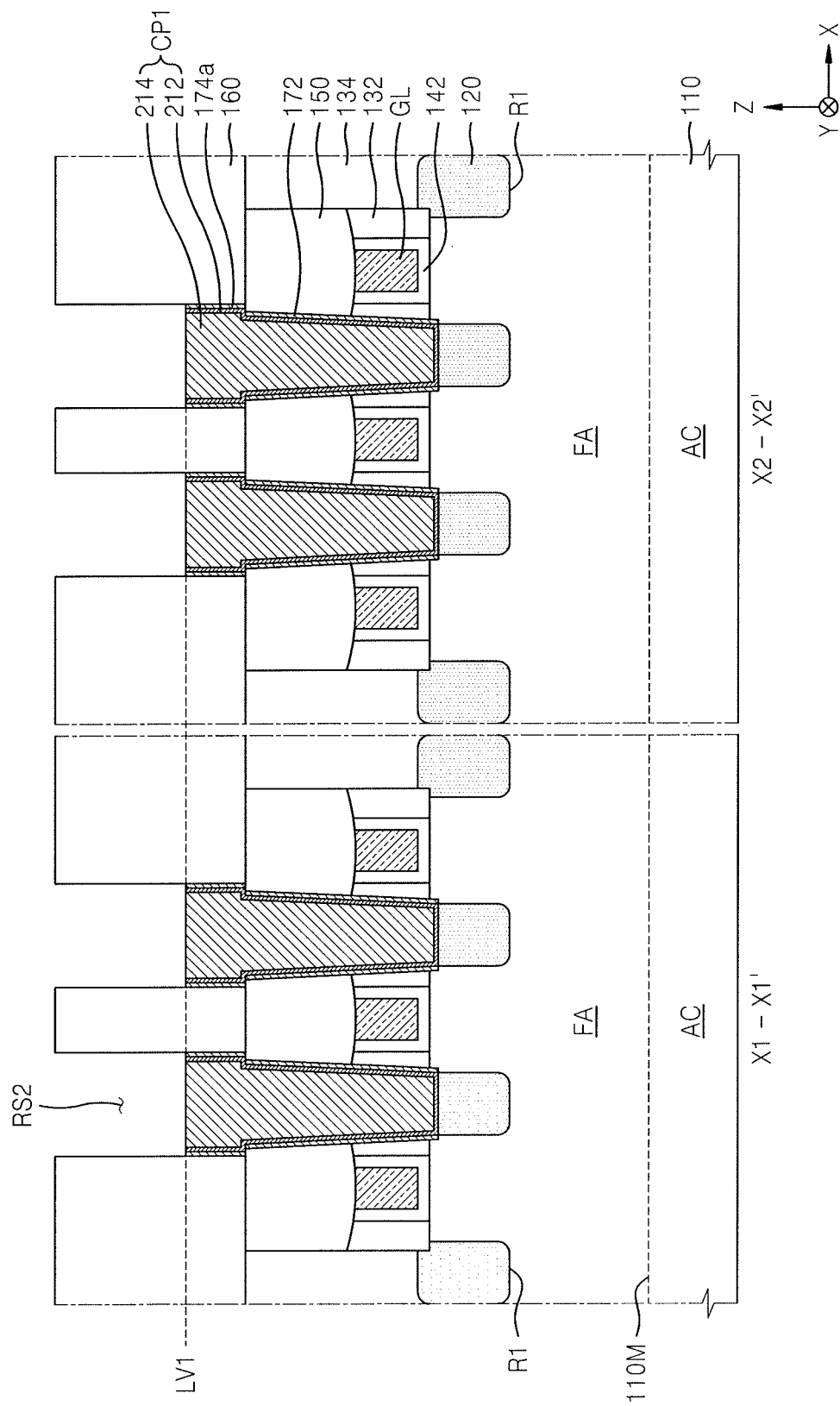
Figure 3I:
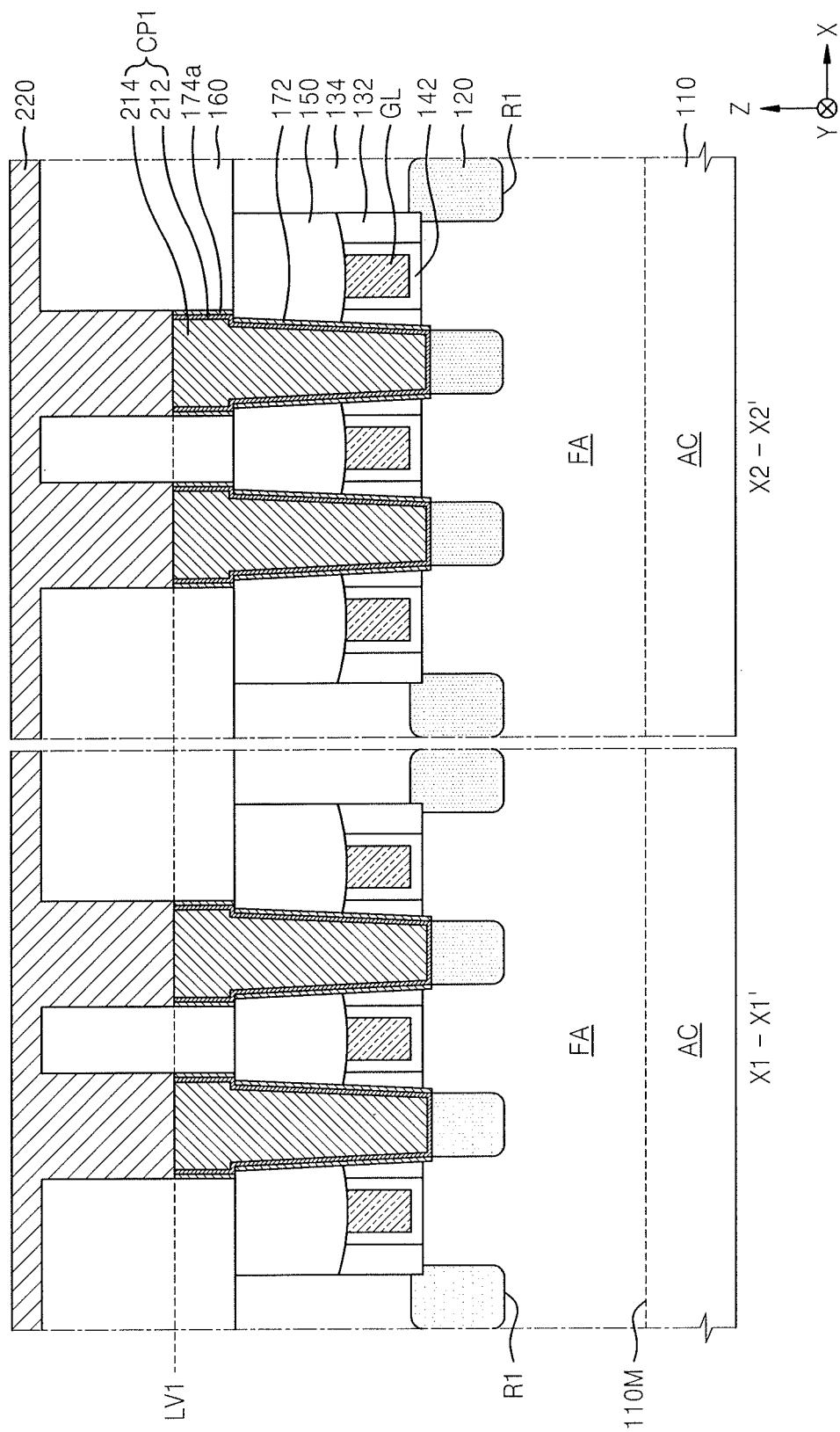
Figure 3J:
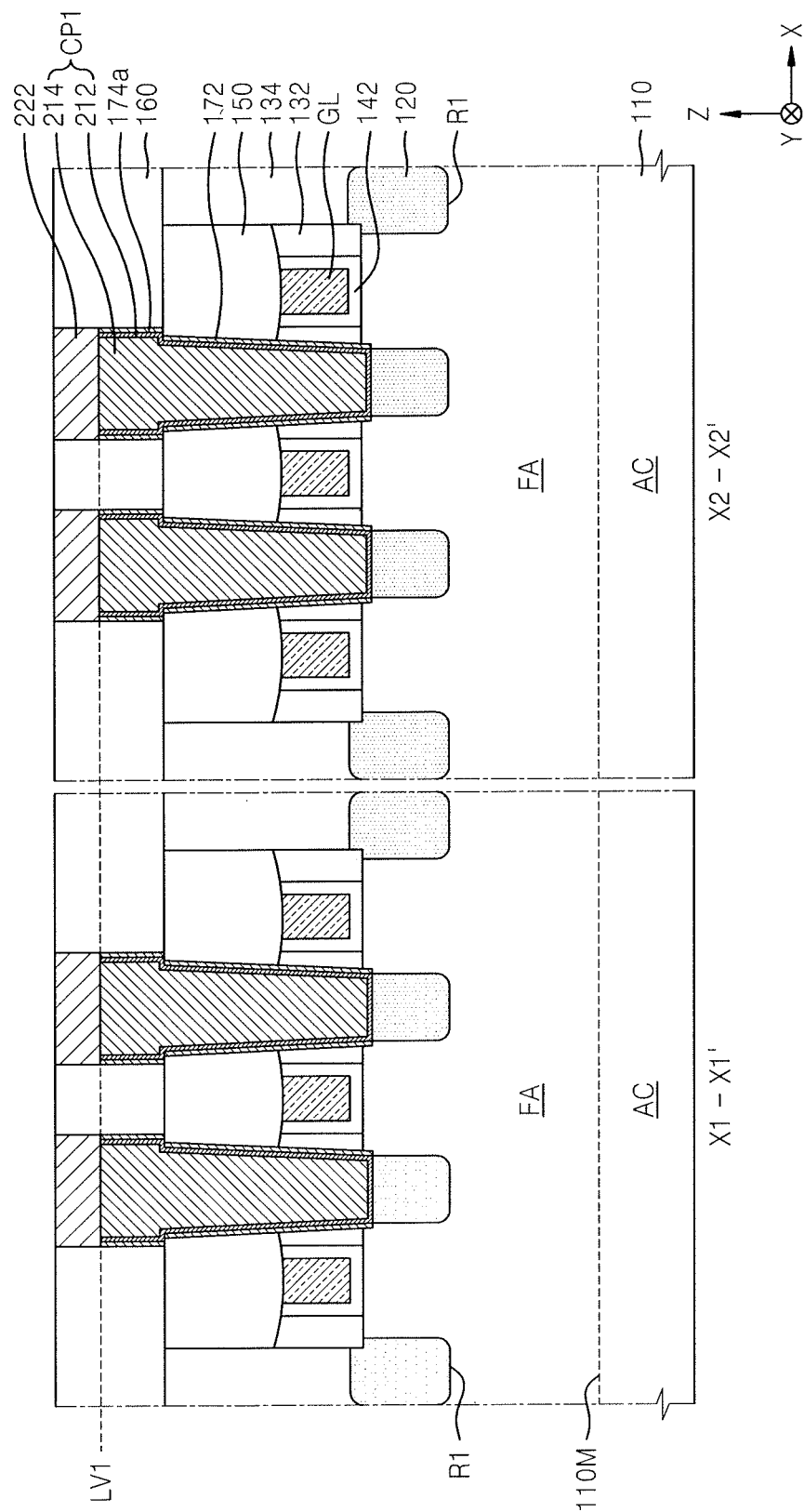
Figure 3K:
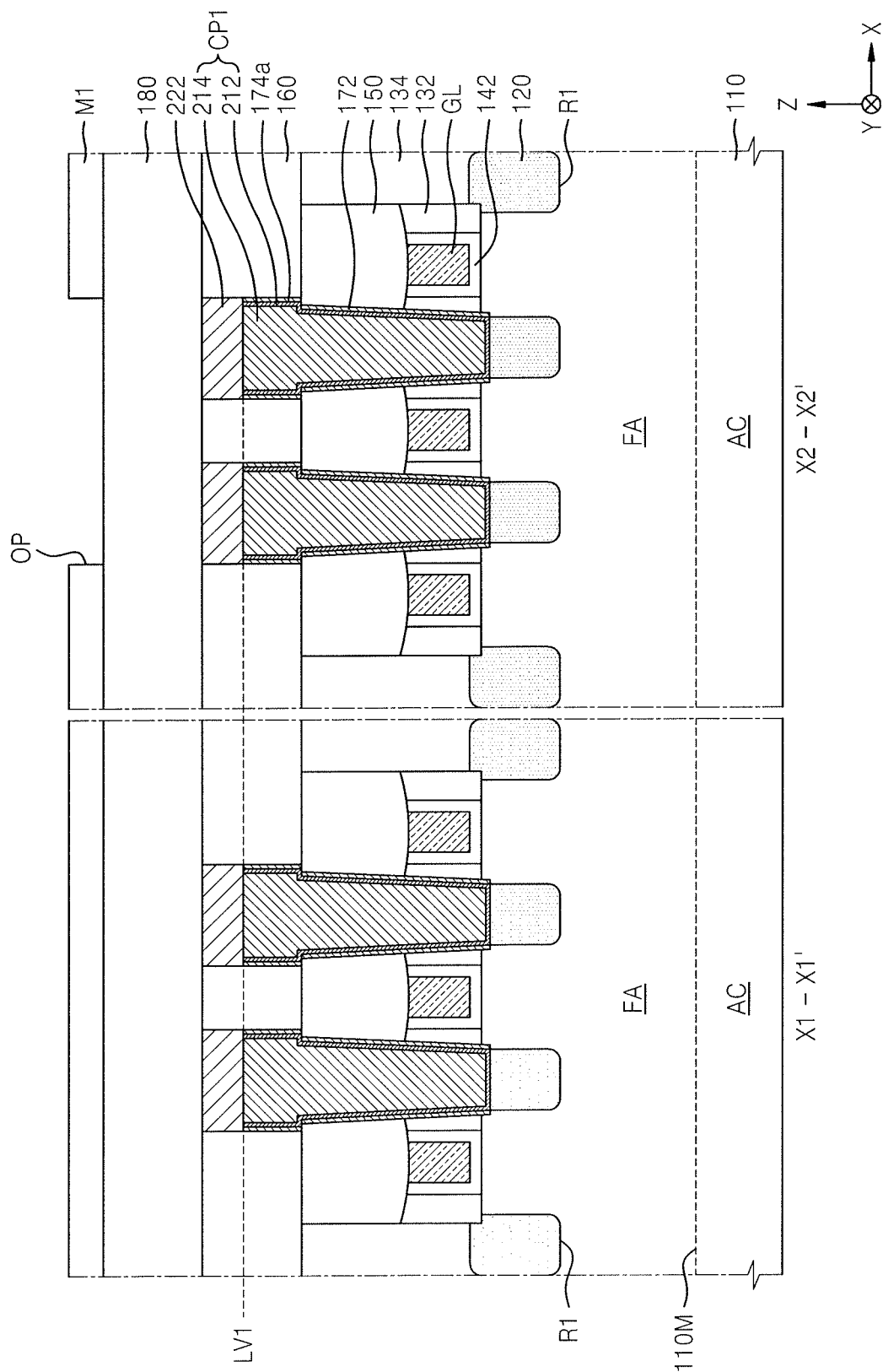
Figure 3L:
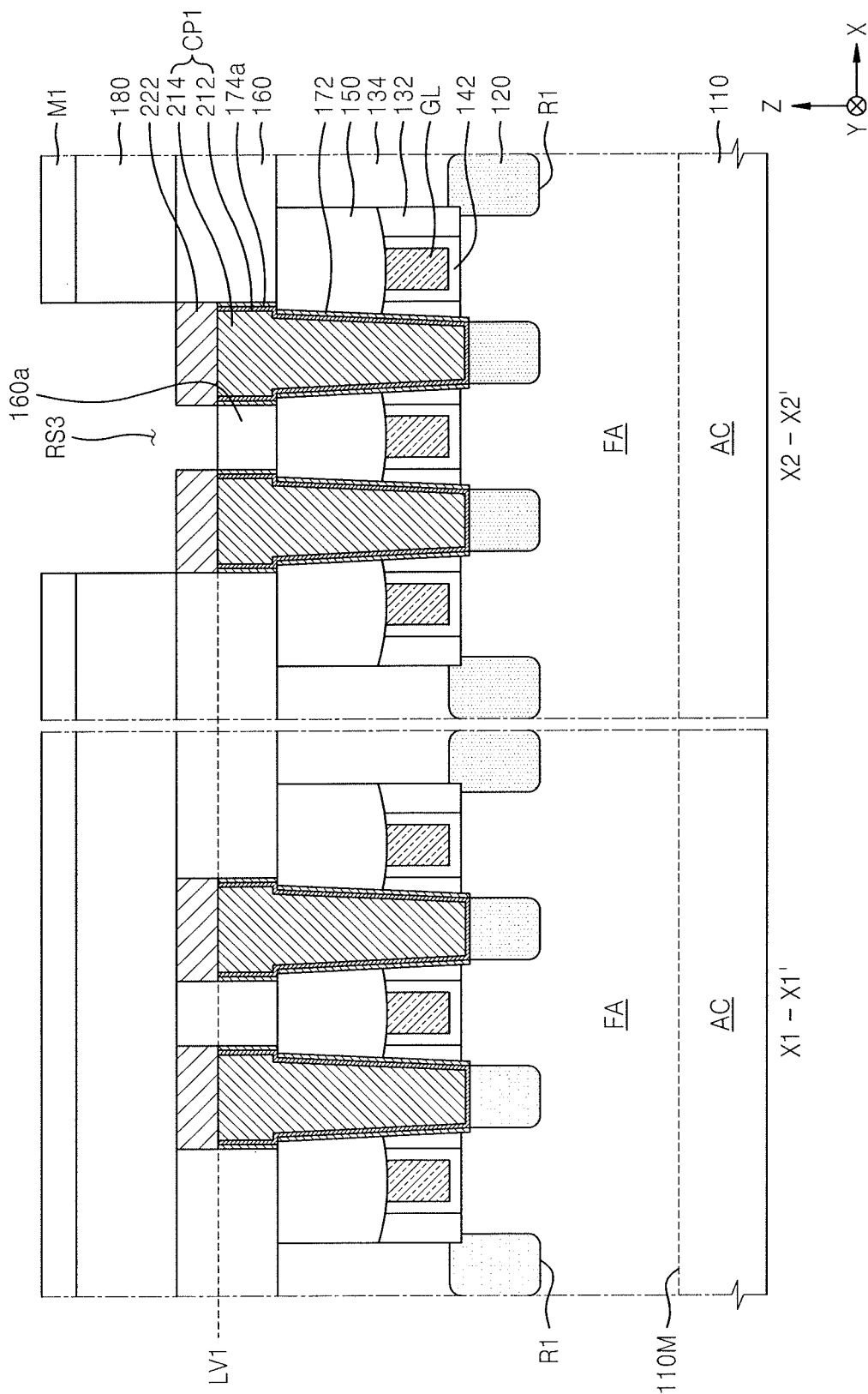
Figure 3M:
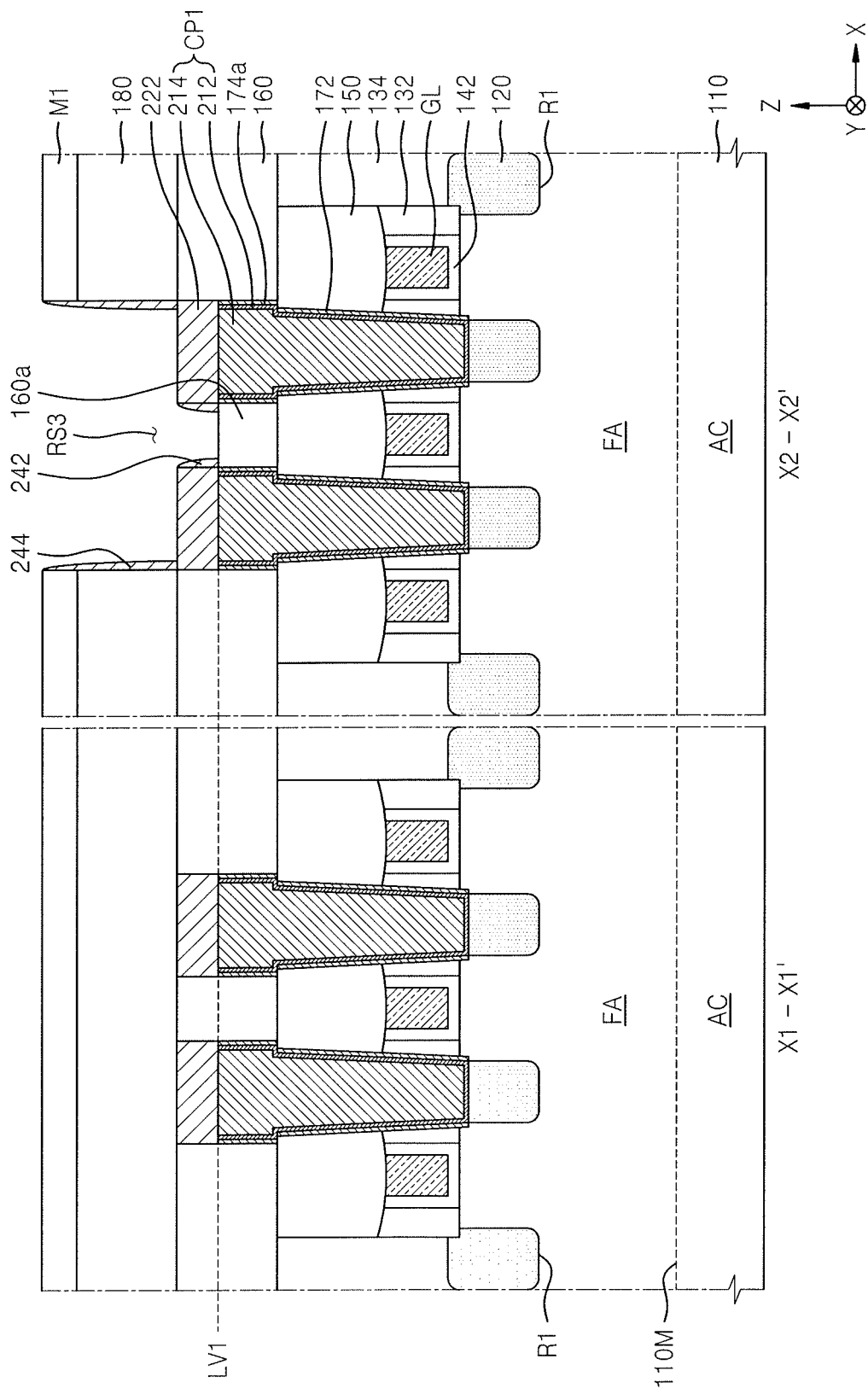
Figure 3N:
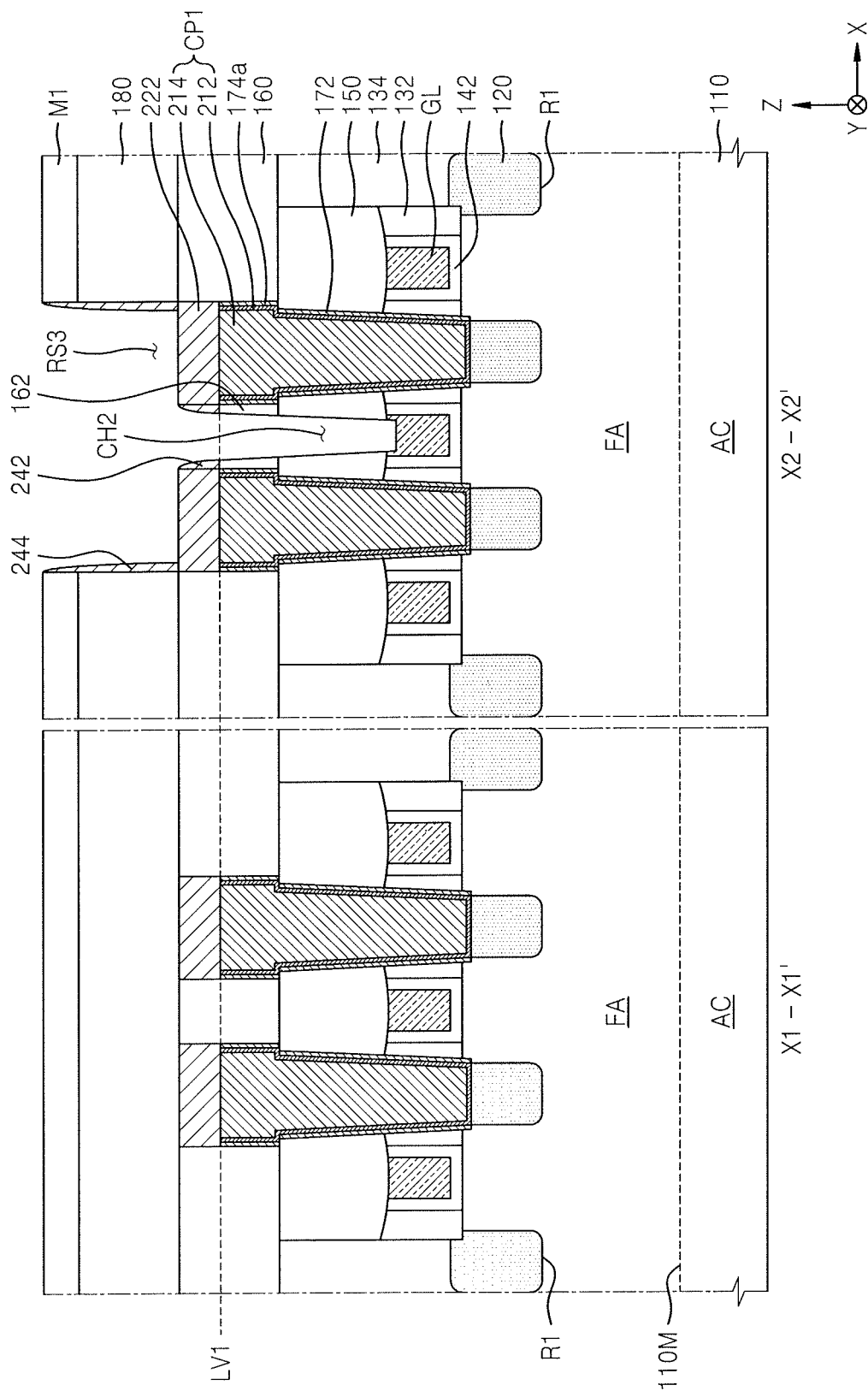
Figure 30:
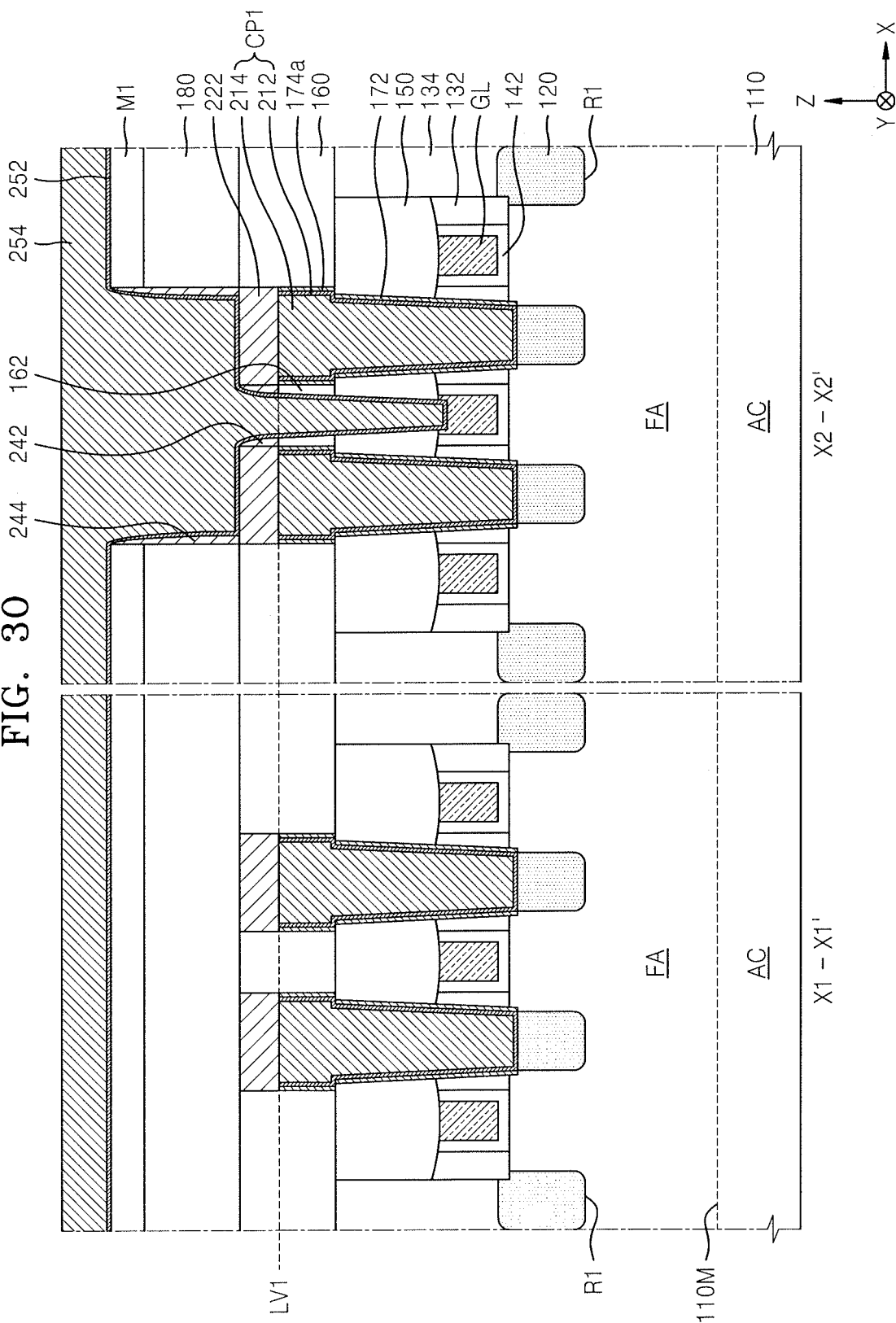
Figure 3P:
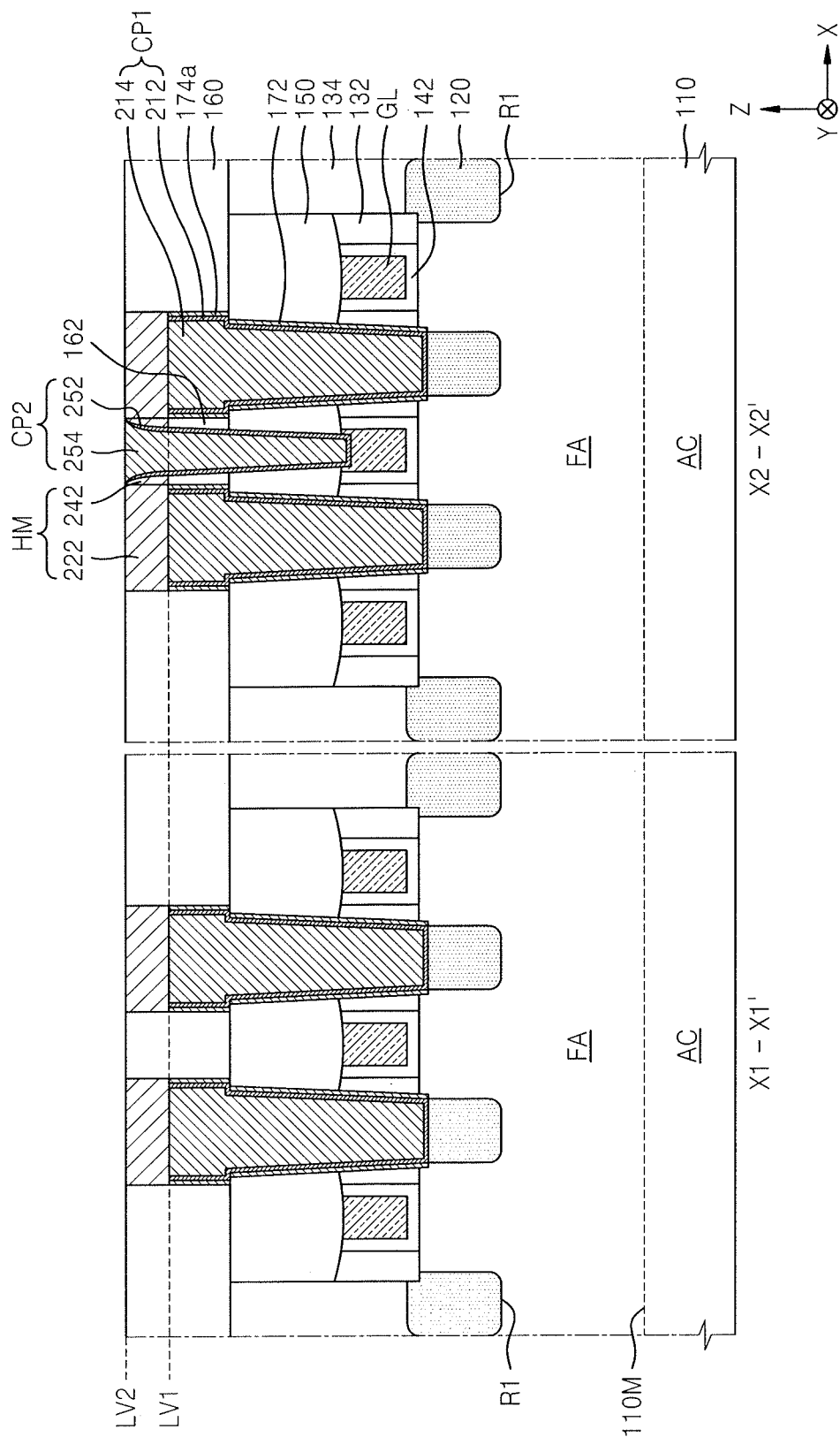
Figure 3Q:
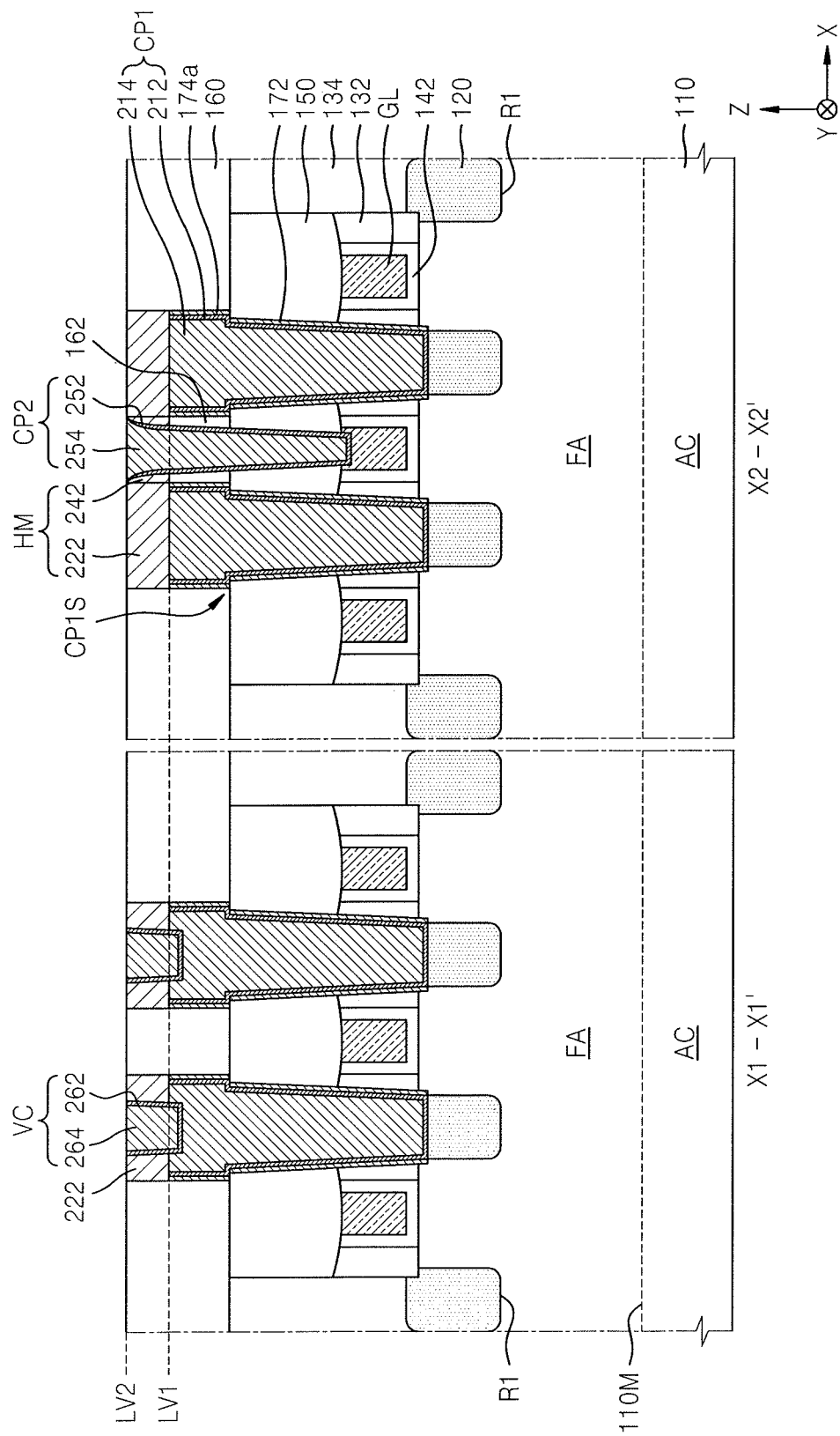

FIGS. 3A through 3Q illustrate cross-sectional views of stages in a method of manufacturing an integrated circuit device in a process order, according to an embodiment. For example, FIGS. 3A through 3Q illustrate cross-sectional views taken along lines X1-X1' and X2-X2' of FIG. 1. In FIGS. 3A through 3Q, the same elements are denoted by the same reference numerals as those in FIGS. 2A and 2B, and a detailed explanation thereof will not be given.

Referring to FIG. 3A, the fin-type active region FA that upwardly protrudes in the third direction (e.g., the Z direction) from the main surface 110M of the substrate 110 and extends in the first direction (e.g., the X direction) may be formed by etching a portion of the device active region AC of the substrate 110. The fin-type active region FA may have a cross-sectional shape as shown in FIG. 2B in the second direction (e.g., the Y direction). The plurality of fin-type active regions FA may be formed on the device active region AC.

The device active region AC of the substrate 110 may be a region for forming a transistor having at least one conductivity type from among a PMOS transistor and an NMOS transistor.

The device isolation film 112 (see FIG. 2B) that covers both lower side walls of a portion of the fin-type active region FA may be formed on the substrate 110. The fin-type active region FA may protrude beyond or above (e.g., farther from the substrate 110 than) a top surface of the device isolation film 112.

Referring to FIG. 3B, a plurality of dummy gate structures DGS extending to intersect the fin-type active region FA may be formed on the fin-type active region FA.

Each of the plurality of dummy gate structures DGS may include a dummy gate insulating film D214, a dummy gate line D216, and a dummy gate capping layer D218 that are sequentially stacked on the fin-type active region FA. The dummy gate insulating film D214 may include silicon oxide. The dummy gate line D216 may include polysilicon. The dummy gate capping layer D218 may include at least one of silicon oxide, silicon nitride, and silicon oxynitride.

The gate insulating spacers 132 may be formed on both side walls of the dummy gate structure DGS. In order to form the gate insulating spacers 132, atomic layer deposition (ALD) or chemical vapor deposition (CVD) may be performed.

A plurality of recess regions R1 may be formed by etching portions of the fin-type active region FA exposed at both sides of the dummy gate structure DGS, and the plurality of source/drain regions 120 may be formed by forming semiconductor layers through epitaxial growth from the plurality of recess regions R1. Each of the plurality of source/drain regions 120 may have a top surface whose level is, e.g., higher than that of a top surface of the fin-type active region FA.

The inter-gate insulating film 134 covering the plurality of source/drain regions 120, the plurality of dummy gate structures DGS, and the gate insulating spacers 132 may be formed. In order to form the inter-gate insulating film 134, an insulating film covering the plurality of source/drain regions 120, the plurality of dummy gate structures DGS, and the gate insulating spacers 132 may be formed to a sufficient thickness, and then a resultant structure including the insulating film may be planarized to expose a top surface of the dummy gate capping layer D218.

Referring to FIG. 3C, a plurality of gate spaces GS may be formed by removing the plurality of dummy gate structures DGS from a resultant structure of FIG. 3B. The gate insulating spacers 132, the fin-type active region FA, and the device isolation film 112 (see FIG. 2B) may be exposed through the plurality of gate spaces GS.

A wet etching process may be performed to remove the plurality of dummy gate structures DGS. In order to perform the wet etching process, an etchant including, e.g., HNO$_3$, diluted fluoric acid (DHF), NH$_4$OH, tetramethyl ammonium hydroxide (TMAH), potassium hydroxide (KOH), or a combination thereof, may be used.

Next, the gate insulating films 142 and gate conductive layers may be formed in the plurality of gate spaces GS. Before the gate insulating films 142 are formed, a process of forming an interface film on a surface of the fin-type active region FA exposed through the plurality of gate spaces GS may be further performed. In order to form the interface film, portions of the fin-type active region FA exposed in the gate spaces GS may be oxidized.

The gate insulating films 142 and the gate conductive layers may be formed to fill the gate spaces GS and to cover a top surface of the inter-gate insulating film 134. The gate insulating film 142 and the gate conductive layer may be formed by using ALD, CVD, physical vapor deposition (PVD), metal organic ALD (MOALD), or metal organic CVD (MOCVD).

The plurality of gate insulating films 142 and the plurality of gate lines GL may be formed in the plurality of gate spaces GS by removing unnecessary portions of the gate insulating films 142 and the gate conductive layers to expose the top surface of the inter-gate insulating film 134.

Referring to FIG. 3D, a plurality of first recess spaces RS1 may be formed over or on the gate lines GL by removing upper portions of the plurality of gate lines GL, the plurality of gate insulating films 142, and the plurality of gate insulating spacers 132. A width of the plurality of first recess spaces RS1 may be limited by the inter-gate insulating film 134.

In an etching process for forming the first recess space RS1, an etch rate of each of the gate line GL and the gate insulating spacers 132 may be controlled so that a level of a top surface of the gate insulating spacers 132 is higher than a level of a top surface of the gate line GL exposed in the first recess space RS1. A height of the gate insulating spacers 132 in the first recess space RS1 may increase away from the gate line GL. A bottom surface of the first recess space RS1 may have a round cross-sectional profile having a lowest level at the gate line GL.

When the gate insulating spacers 132 include a material film, e.g., a SiOCN film, a SiCN film, or a combination thereof, having a dielectric constant that is lower than that of a silicon nitride film, an undesired parasitic capacitance between the gate line GL and a conductive structure formed adjacent to the gate line GL in a subsequent process, e.g., the first conductive plug CP1 (see FIG. 3H), may be suppressed by covering both side walls of the gate line GL to a sufficient height by using the gate insulating spacers 132 formed of a low-k material.

Next, the gate insulating capping layer 150 filling the first recess space RS1 may be formed. The gate insulating capping layer 150 may be formed by forming a capping material layer to fill the inside of the first recess space RS1 and cover the top surface of the inter-gate insulating film 134 and then removing an unnecessary or selected portion of the capping material layer to expose the top surface of the inter-gate insulating film 134. The gate insulating capping layer 150 may include, e.g., a silicon nitride film.

Referring to FIG. 3E, the upper insulating layer 160 covering the inter-gate insulating film 134 and the gate insulating capping layer 150 is formed, and a plurality of first contact holes CH1 each passing through the upper insulating layer 160, the inter-gate insulating film 134, and the gate insulating capping layer 150 and exposing the plurality of source/drain regions 120 are formed. In a process of forming each of the plurality of first contact holes CH1, although a portion of the gate insulating spacers 132 may also be removed, the gate insulating film 142 and the gate line GL in the plurality of first contact holes CH1 may not be exposed. The upper insulating layer 160 may include a silicon oxide film. For example, the upper insulating layer 160 may include a TEOS film, or a ULK film having an ultra-low dielectric constant ranging from about 2.2 to about 2.4. The ULK film may include a SiOC film or a SiCOH film.

In an implementation, in an etching process for forming the plurality of first contact holes CH1, an etch rate of the upper insulating layer 160 may be higher than an etch rate of the gate insulating capping layer 150. In this case, each of the plurality of first contact holes CH1 may be formed so that a width of a portion of the first contact hole CH1 formed in the upper insulating layer 160 is greater than a width of a portion of the first contact hole CH1 formed in the gate insulating capping layer 150, and may have a stepped portion at an interface between the upper insulating layer 160 and the gate insulating capping layer 150.

A cover layer conformably covering a top surface of the upper insulating layer 160 and an inner surface and a bottom surface of each of the plurality of first contact holes CH1 may be formed, and the first side cover layer 172 covering surfaces of the gate insulating spacers 132 and the gate insulating capping layer 150 from among inner surfaces of each of the plurality of first contact holes CH1 and a second side cover layer 174 covering a surface of the upper insulating layer 160 may be formed by performing anisotropic etching on the cover layer. When each of the plurality of first contact holes CH1 has a stepped portion at an interface between the upper insulating layer 160 and the gate insulating capping layer 150, the first side cover layer 172 and the second side cover layer 174 may be spaced apart from each other or otherwise discontinuous. The cover layer may be formed of, e.g., silicon nitride.

Referring to FIG. 3G, the first conductive barrier layer 212 and the first conductive core layer 214 may be formed in each of the plurality of first contact holes CH1. The first conductive barrier layer 212 and the first conductive core layer 214 may be formed to fill the inside of the first contact hole CH1 and cover the top surface of the upper insulating layer 160. The first conductive barrier layer 212 may be formed of Ti, Ta, TiN, TaN, or a combination thereof, and the first conductive core layer 214 may be formed of Co, W, or a combination thereof.

Referring to FIG. 3H, the plurality of first conductive plugs CP1 filling lower portions of the plurality of first contact holes CH1 and each including the first conductive barrier layer 212 and the first conductive core layer 214 may be formed by removing unnecessary or selected portions of the first conductive barrier layer 212 and the first conductive core layer 214 so that the top surface of the upper insulating layer 160 is exposed and a plurality of second recess spaces RS2 are formed in upper portions of the plurality of first contact holes CH1 (see FIG. 3F).

A level of each of top surfaces of the plurality of first conductive plugs CP1 may be at the first level LV1 (that is lower than a level of the top surface of the upper insulating layer 160).

In a process of forming each of the plurality of first conductive plugs CP1, a portion of the second side cover layer 174 that is higher than the first level LV1 of FIG. 3G may also be removed. Accordingly, the second side cover layer 174a may cover a side surface of the first conductive plug CP1, and a level of an uppermost end of the second side cover layer 174a may be at the first level LV1 that is a level of the top surface of the first conductive plug CP1.

Referring to FIG. 3I, a mask layer 220 filling each of the second recess spaces RS2 may be formed on a resultant structure of FIG. 3H. The mask layer 220 may be formed to fill the inside of the second recess space RS2 and cover the top surface of the upper insulating layer 160. The mask layer 220 may be formed of a silicon carbide material. For example, the mask layer 220 may be formed of SiC, SiOCN, SiCN, or a combination thereof.

Referring to FIG. 3J, a cover mask layer 222 may be formed by removing an upper portion of the upper insulating layer 160 and an upper portion of the mask layer 220 from a resultant structure of FIG. 3I. In order to form the cover mask layer 222, the upper portion of the upper insulating layer 160 and the upper portion of the mask layer 220 may be removed by using chemical mechanical polishing (CMP). The cover mask layer 222 may cover the top surface of the first conductive plug CP1.

Referring to FIG. 3K, a protective insulating layer 180 covering the upper insulating layer 160 and the cover mask layer 222 may be formed. The protective insulating layer 180 may include a silicon oxide film. For example, the protective insulating layer 180 may include a TEOS film. A mask pattern M1 having an opening OP may be formed on the protective insulating layer 180. The opening OP may expose portions of the protective insulating layer 180 corresponding to the second conductive plug CP2 and an upper portion of the cover mask layer 222 adjacent to the second conductive plug CP2 of FIG. 2A.

Referring to FIG. 3L, a third recess space RS3 (through which the portion 160a of the upper insulating layer 160 is exposed) may be formed in a bottom surface by removing portions of the protective insulating layer 180 and the upper insulating layer 160 by using the mask pattern M1 and the cover mask layer 222 as etch masks.

A level of a top surface of the portion 160a of the upper insulating layer 160 exposed at a bottom surface of the third recess space RS3 may be at the first level LV1 (that is a level of the top surface of each of the plurality of first conductive plugs CP1).

Referring to FIG. 3M, a preliminary spacer layer covering a top surface of the protective insulating layer 180 and an inner surface and the bottom surface of the third recess space RS3 may be formed, and then the cover spacer 242 covering a side surface of the cover mask layer 222 and a residual spacer 244 covering a side surface of the protective insulating layer 180 in the third recess space RS3 may be formed by performing anisotropic etching on the preliminary spacer layer and removing a portion of the preliminary spacer layer formed on the top surface of the portion 160a of the upper insulating layer 160 exposed in the third recess space RS3. In an implementation, the preliminary spacer layer may be formed of the same material as that of the cover mask layer 222. For example, the preliminary spacer layer may be formed of a silicon carbide material having the same carbon content as that of the cover mask layer 222.

Referring to FIG. 3N, a second contact hole CH2 that communicates with or is open to the third recess space RS3 and exposes the gate line GL may be formed by performing an etching process on a resultant structure of FIG. 3M by using the cover mask layer 222 and the cover spacer 242 as etch masks. The second contact hole CH2 may pass through the portion 160a of the upper insulating layer 160 and the gate insulating capping layer 150 and may expose the gate line GL at a bottom surface thereof.

In an etching process of forming the second contact hole CH2, a portion of the portion 160a of the upper insulating layer 160 under the cover spacer 242 may not be removed and may remain as the side wall insulating capping layer 162 covering a side surface of an upper portion of the first conductive plug CP1.

The gate insulating spacers 132, the gate insulating capping layer 150, and the side wall insulating capping layer 162 may be sequentially formed on an inner space of the second contact hole CH2. Also, a side surface of the first conductive plug CP1 may be sequentially covered by the gate insulating spacers 132, the gate insulating capping layer 150, and the side wall insulating capping layer 162.

Accordingly, the second contact hole CH2 may be formed by using an SAC process using the cover mask layer 222 and the cover spacer 242, and the side wall insulating capping layer 162 remaining due to the cover spacer 242 during an etching process for forming the second contact hole CH2 may cover the side wall of the first conductive plug CP1, and may prevent the first conductive plug CP1 from being exposed in the second contact hole CH2.

Referring to FIG. 3O, the second conductive barrier layer 252 and the second conductive core layer 254 filling the second contact hole CH2 and the third recess space RS3 may be formed on a resultant structure of FIG. 3N. The second conductive barrier layer 252 and the second conductive core layer 254 may be formed to fill the insides of the second contact hole CH2 and the third recess space RS3 and cover the top surface of the upper insulating layer 160. The second conductive barrier layer 252 may be formed of Ti, Ta, TiN, TaN, or a combination thereof, and the second conductive core layer 254 may be formed of Co, W, or a combination thereof.

Referring to FIG. 3P, the second conductive plug CP2 filling the second contact hole CH2 (see FIG. 3N), including the second conductive barrier layer 252 and the second conductive core layer 254, and having a bottom surface connected to the gate line GL may be formed by removing unnecessary or selected portions of the second conductive barrier layer 252 and the second conductive core layer 254 to expose a top surface of the cover mask layer 222.

A level of a top surface of the second conductive plug CP2 may be higher than the first level LV1 (that is a level of the top surface of the first conductive plug CP1). A level of the top surface of the second conductive plug CP2 may be at a level of the top surface of the cover mask layer 222, e.g., at the second level LV2 (that is a level of the top surface of the upper insulating layer 160).

The cover mask layer 222 and the cover spacer 242 may be formed of the same material and may constitute the hard mask layer HM.

Referring to FIG. 3Q, the plurality of via contacts VC that are conductive and are connected to the plurality of first conductive plugs CP1 may be formed by passing through the cover mask layer 222.

Next, as shown in FIGS. 2A and 2B, the integrated circuit device 100 may be formed by forming the first wiring 300, the first inter-wiring insulating layer 320, the first inter-wiring plug 340, the second wiring 400, the second inter-wiring insulating layer 420, and the second inter-wiring plug 440.

Figure 4A:
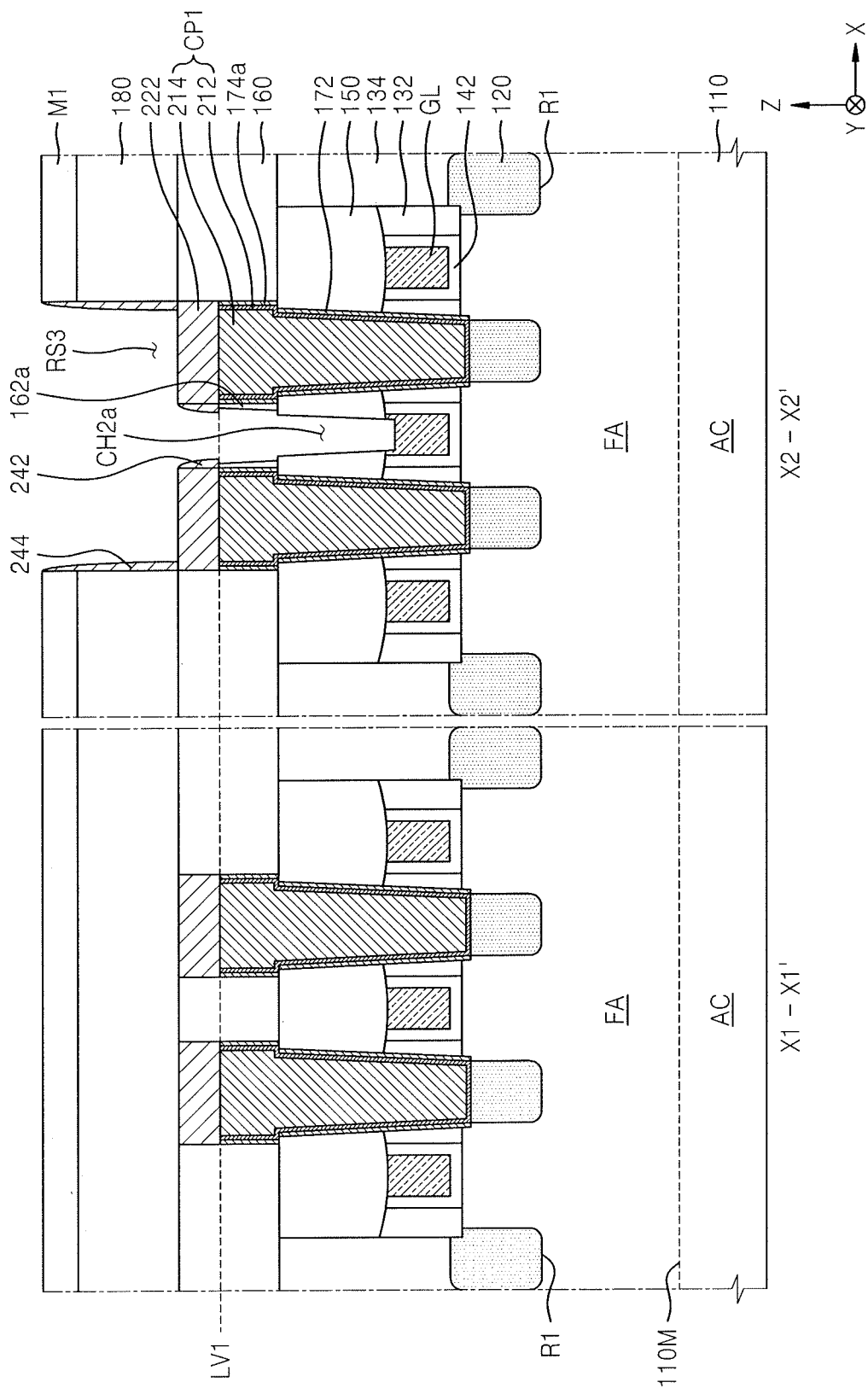
FIG. 4A illustrates a cross-sectional view of a stage in a method of manufacturing an integrated circuit device, according to an embodiment.
Figure 4B:
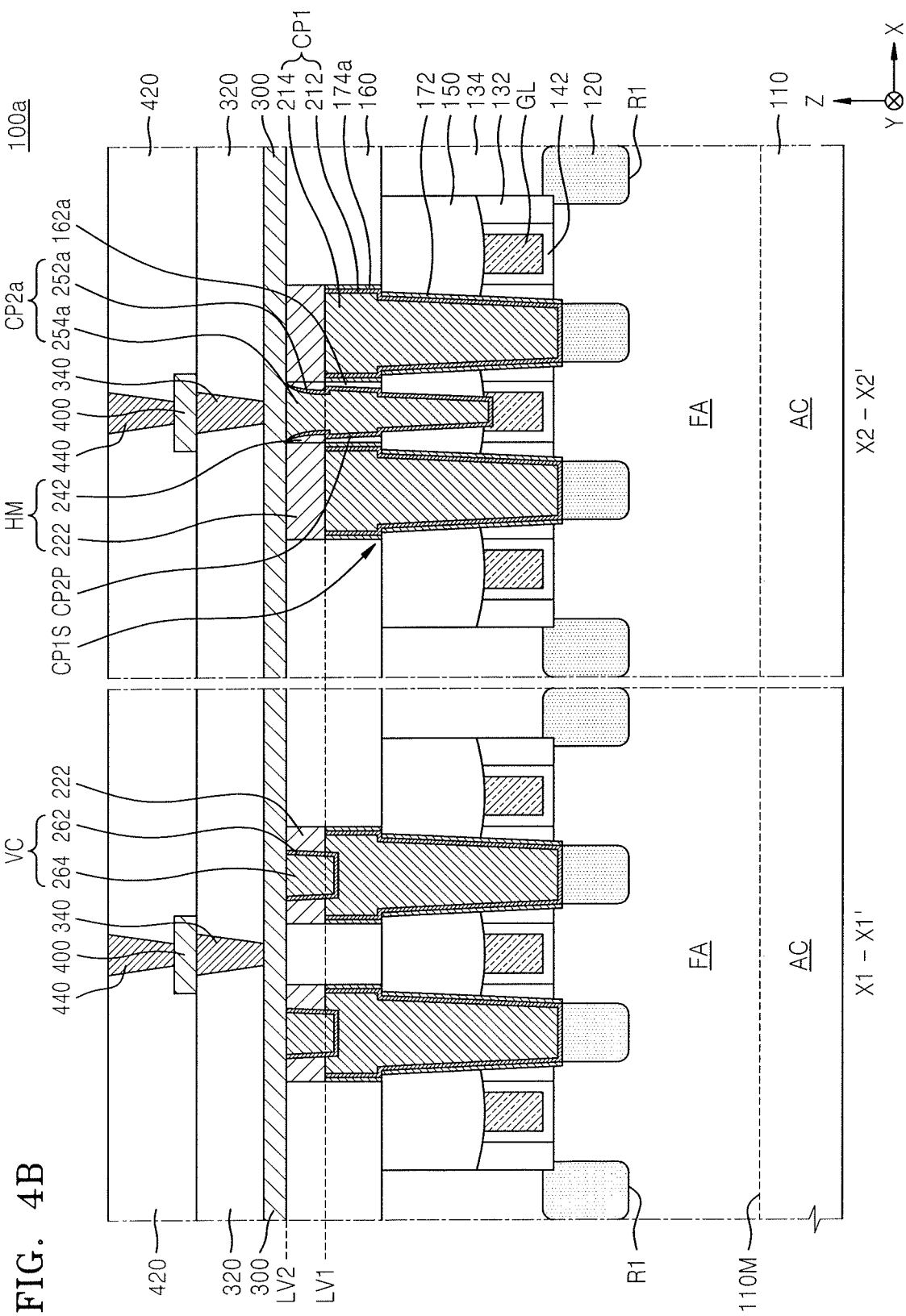
FIG. 4B illustrates a cross-sectional view of an integrated circuit device according to an embodiment.

FIG. 4A illustrates a cross-sectional view of a stage in a method of manufacturing an integrated circuit device, according to an embodiment. FIG. 4B illustrates a cross-sectional view of an integrated circuit device 100a, according to an embodiment. For example, FIGS. 4A and 4B illustrate cross-sectional views taken along lines X1-X1' and X2-X2' of FIG. 1.

Referring to FIG. 4A, a second contact hole CH2a communicating with the third recess space RS3 and exposing the gate line GL may be formed by performing an etching process on a resultant structure of FIG. 3M by using the cover mask layer 222 and the cover spacer 242 as etch masks. The second contact hole CH2a may pass through the portion 160a (see FIG. 3M) of the upper insulating layer 160 and the gate insulating capping layer 150 and may expose the gate line GL at a bottom surface thereof.

In an etching process of forming the second contact hole CH2a, a region of the portion 160a of the upper insulating layer 160 located under the cover spacer 242 may not be removed and may remain as a side wall insulating capping layer 162a covering a side surface of an upper portion of the first conductive plug CP1.

In an etching process for forming the second contact hole CH2a, when an etch rate of the upper insulating layer 160 is higher than an etch rate of the gate insulating capping layer 150, a width of the side wall insulating capping layer 162a in the horizontal direction (e.g., the X-Y planar direction) may be less than a width of the side wall insulating capping layer 162 of FIG. 3N. In this case, the second contact hole CH2a may outwardly extend toward the side wall insulating capping layer 162a.

Accordingly, a portion of a bottom surface of the cover spacer 242 may contact a top surface of the side wall insulating capping layer 162a, a remaining portion of the bottom surface of the cover spacer 242 may not contact the top surface of the side wall insulating capping layer 162a, and the cover spacer 242 may be shaped so that a portion of the cover spacer 242 protrudes from the cover mask layer 222 toward the second contact hole CH2a beyond the side wall insulating capping layer 162a and overhangs from the side wall insulating capping layer 162a.

Referring to FIG. 4B, the integrated circuit device 100a may be formed on a resultant structure of FIG. 4A by forming the second conductive plug CP2a filling the second contact hole CH2a by performing a process similar to that of FIGS. 3O through 3Q. The second conductive plug CP2a may include a second conductive barrier layer 252a and a second conductive core layer 254a. The second conductive plug CP2a may have a projection CP2P protruding (e.g., laterally) toward the side wall insulating capping layer 162a.

The integrated circuit device 100a of FIG. 4B is the same as the integrated circuit device 100 of FIGS. 2A and 2B except that a width of the side wall insulating capping layer 162a in the horizontal direction (e.g., the X-Y planar direction) is less than a width of the side wall insulating capping layer 162 and the second conductive plug CP2a outwardly protrudes toward the side wall insulating capping layer 162a, and thus a detailed explanation thereof will not be given.

A portion of the bottom surface of the cover spacer 242 may contact the top surface of the side wall insulating capping layer 162a, and a remaining portion of the bottom surface of the cover spacer 242 may contact a portion of the second conductive plug CP2a outwardly protruding toward the side wall insulating capping layer 162a.

Figure 5B:
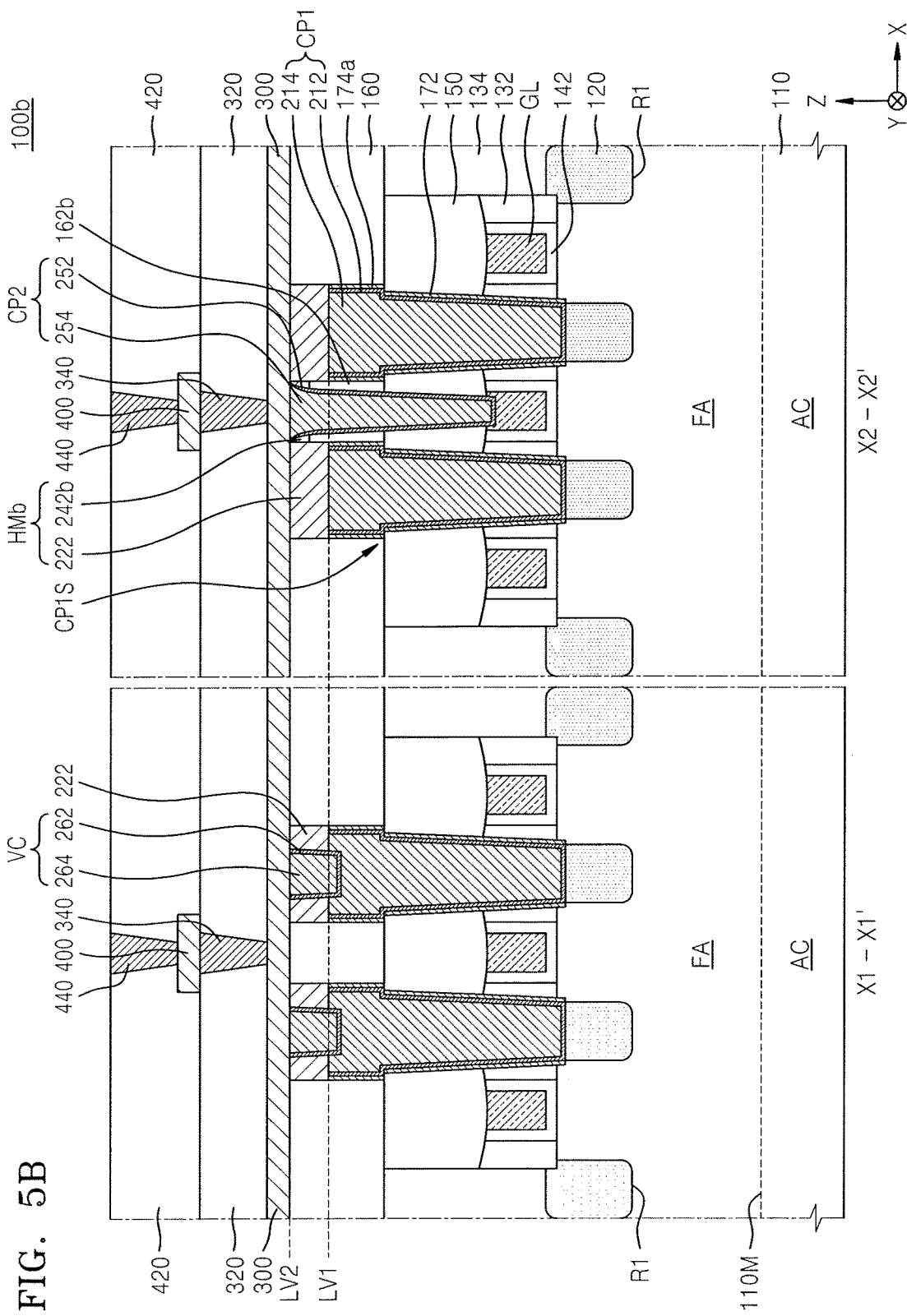
FIG. 5B illustrates a cross-sectional view of an integrated circuit device according to an embodiment.

FIG. 5A illustrates a cross-sectional view of a stage in a method of manufacturing an integrated circuit device, according to an embodiment. FIG. 5B illustrates a cross-sectional view of an integrated circuit device 100b, according to an embodiment. For example, FIGS. 5A and 5B illustrate cross-sectional views taken along lines X1-X1' and X2-X2' of FIG. 1.

Referring to FIG. 5A, a third recess space RS3a exposing a portion 160b of the upper insulating layer 160 at a bottom surface thereof may be formed on a resultant structure of FIG. 3K by removing portions of the protective insulating layer 180 and the upper insulating layer 160 by using the mask pattern M1 and the cover mask layer 222 as etch masks.

A level of a top surface of the portion 160b of the upper insulating layer 160 exposed at the bottom surface of the third recess space RS3a may be higher than the first level LV1 that is a level of a top surface of each of the plurality of first conductive plugs CP1.

Referring to FIG. 5B, the integrated circuit device 100b may be formed on a resultant structure of FIG. 5A by forming a second conductive plug CP by performing a process similar to that of FIGS. 3M through 3Q.

The integrated circuit device 100b may include a hard mask layer HMb including the cover mask layer 222 and a cover spacer 242b covering a side surface of the cover mask layer 222. A bottom surface of the cover spacer 242b may have or be at a level that is higher than that of a bottom surface of the cover mask layer 222. A portion of the upper insulating layer 160 located under the cover spacer 242b may be a side wall insulating capping layer 162b surrounding a side surface of an upper portion of the first conductive plug CP1 and a side surface of a lower portion of the cover mask layer 222.

For example, each of the bottom surface of the cover spacer 242b and a top surface of the side wall insulating capping layer 162b may have or be at a level that is higher than the first level LV1 (that is a level of the top surface of the first conductive plug CP1).

The integrated circuit device 100b of FIG. 5B is the same as the integrated circuit device 100 of FIGS. 2A and 2B except that the side wall insulating capping layer 162b further extends in the third direction (e.g., the Z direction) perpendicular to the main surface 110M of the substrate 110 and covers the side surface of the lower portion of the cover mask layer 222, and thus a detailed explanation thereof will not be given.

Figure 6A:
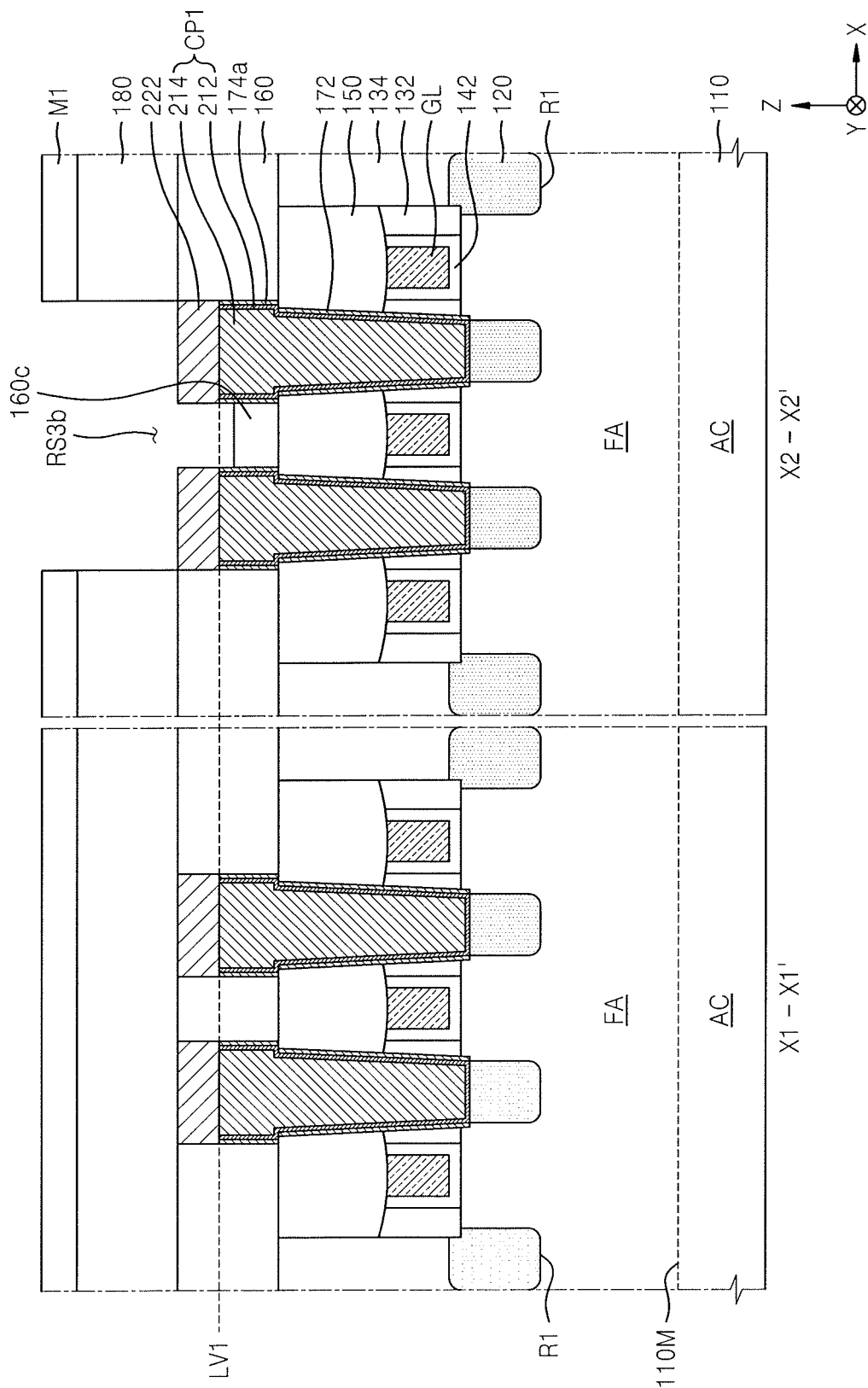
FIG. 6A illustrates a cross-sectional view of a stage in a method of manufacturing an integrated circuit device, according to an embodiment.
Figure 6B:
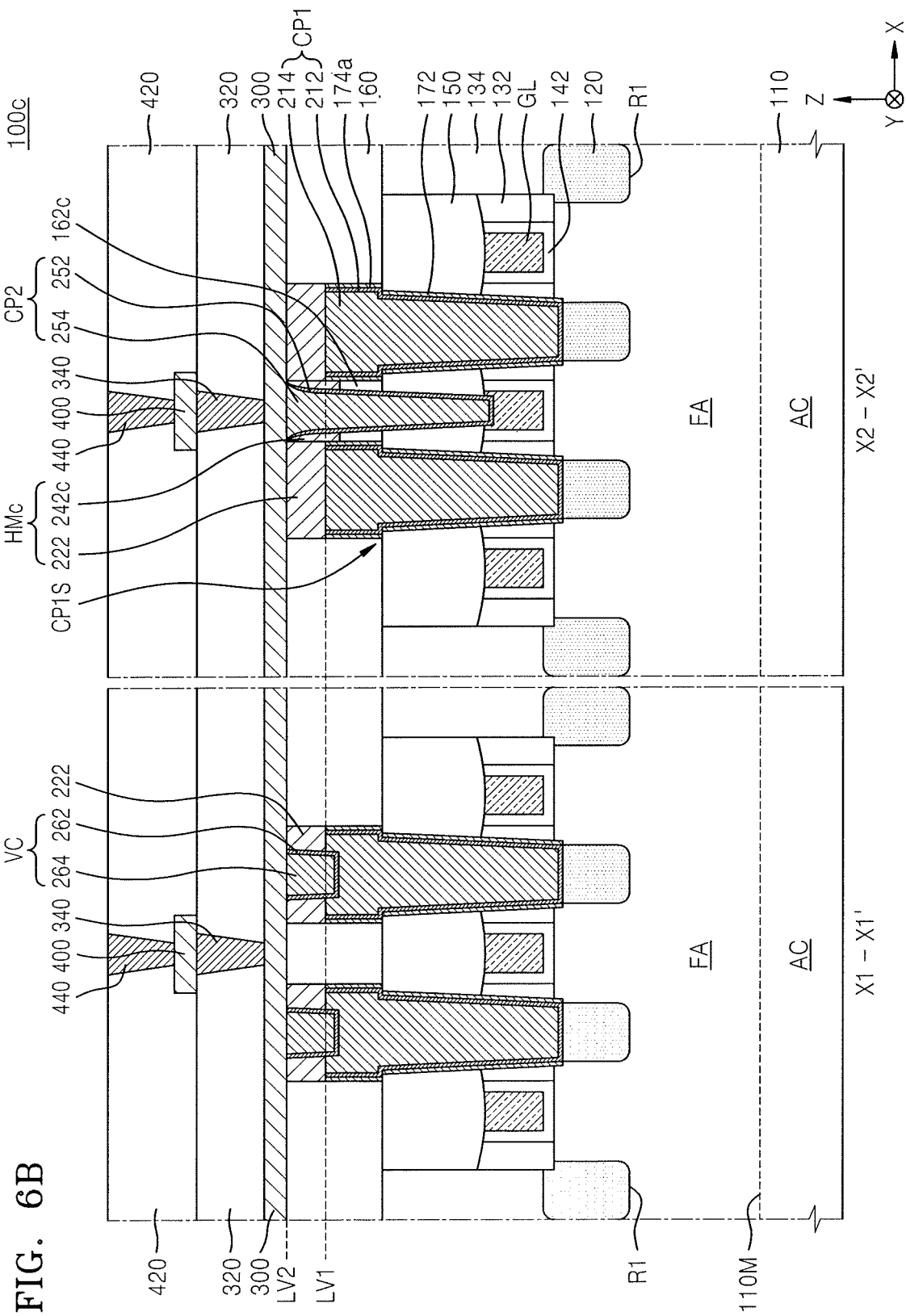
FIG. 6B illustrates a cross-sectional view of an integrated circuit device according to an embodiment.

FIG. 6A illustrates a cross-sectional view of a stage in a method of manufacturing an integrated circuit device, according to an embodiment. FIG. 6B illustrates a cross-sectional view of an integrated circuit device 100c according to an embodiment. For example, FIGS. 6A and 6B illustrate cross-sectional views taken along lines X1-X1' and X2-X2' of FIG. 1.

Referring to FIG. 6A, a third recess space RS3b exposing a portion 160c of the upper insulating layer 160 at a bottom surface may be formed on a resultant structure of FIG. 3K by removing portions of the protective insulating layer 180 and the upper insulating layer 160 by using the mask pattern M1 and the cover mask layer 222 as etch masks.

A level of a top surface of the portion 160c of the upper insulating layer 160 exposed at the bottom surface of the third recess space RS3b may be lower than the first level LV1 (that is a level of a top surface of each of the plurality of first conductive plugs CP1).

Referring to FIG. 6B, the integrated circuit device 100c may be formed on a resultant structure of FIG. 6A by forming a second conductive plug CP by performing a process similar to that of FIGS. 3M through 3Q.

The integrated circuit device 100c may include a hard mask layer HMc including the cover mask layer 222 and a cover spacer 242c covering a side surface of the cover mask layer 222. The cover spacer 242c may protrude toward the substrate 110 beyond or below a bottom surface of the cover mask layer 222. A portion of the cover spacer 242c protruding toward the substrate 110 beyond the bottom surface of the cover mask layer 222 may cover a side surface of an upper portion of the first conductive plug CP1. A portion of the upper insulating layer 160 located under the cover spacer 242c may be a side wall insulating capping layer 162c covering a side surface adjacent to the upper portion of the first conductive plug CP1.

For example, each of a bottom surface of the cover spacer 242c and a top surface of the side wall insulating capping layer 162c may have or be at a level lower than the first level LV1 (that is a level of the top surface of the first conductive plug CP1).

Accordingly, a side surface of the first conductive plug CP1 may be covered by a portion of the cover spacer 242c, the side wall insulating capping layer 162c, the gate insulating capping layer 150, and the gate insulating spacers 132 along a lower end from an upper end.

The integrated circuit device 100c of FIG. 6B is the same as the integrated circuit device 100 of FIGS. 2A and 2B except that the cover spacer 242c may further protrude toward the substrate 110 and may cover the side surface of the upper portion of the first conductive plug CP1 and the side wall insulating capping layer 162c has a height that is less than that of the side wall insulating capping layer 162 by a height of a portion of the cover spacer 242c protruding toward the substrate 110 beyond the bottom surface of the cover mask layer 222, and thus a detailed explanation thereof will not be given.

Accordingly, the hard mask layer HMc including the cover mask layer 222 and the cover spacer 242c covering the side surface of the cover mask layer 222 may cover both the top surface of the first conductive plug CP1 and the side surface of the upper portion of the first conductive plug CP1.

Figure 7A:
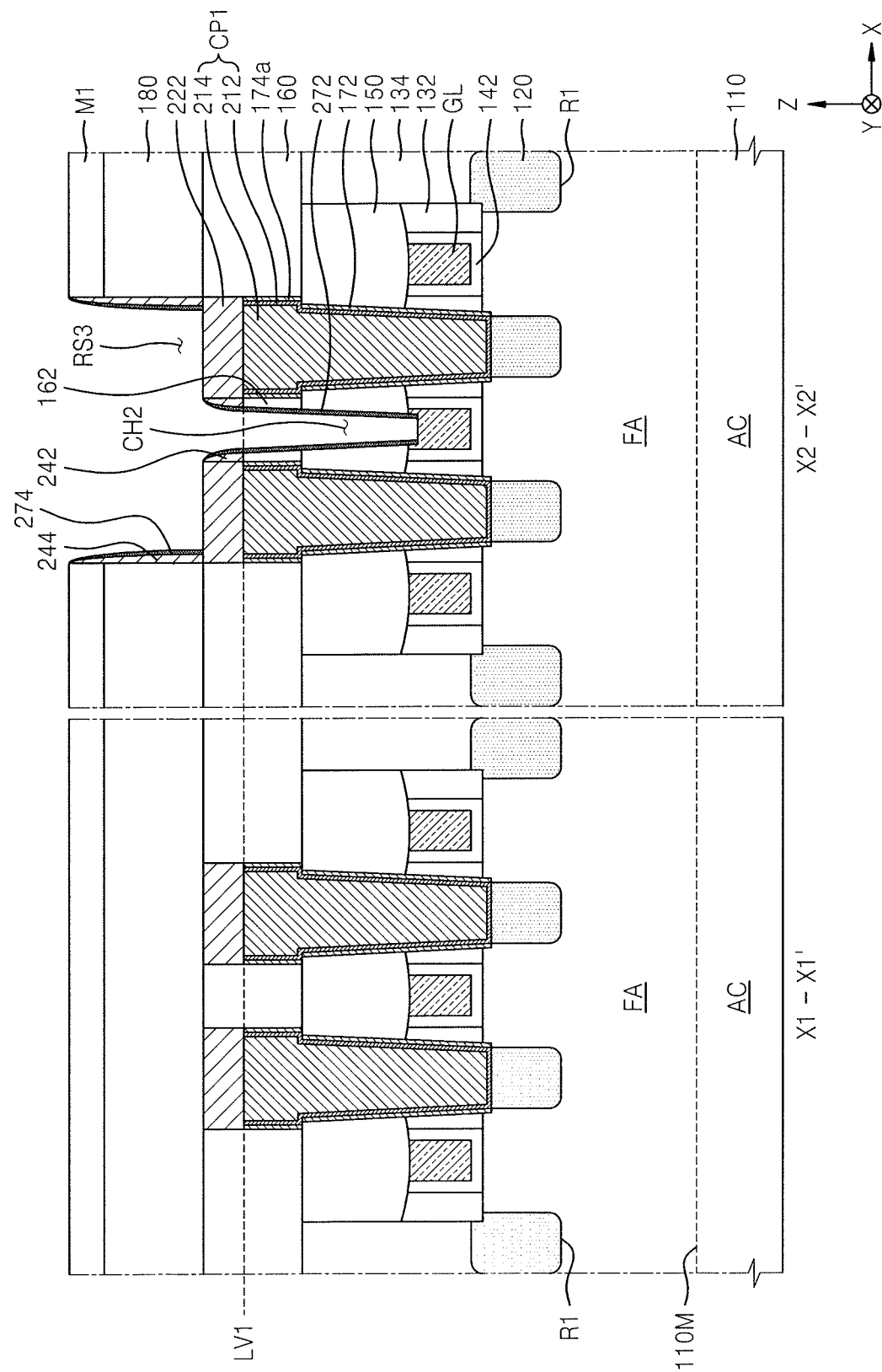
FIG. 7A illustrates a cross-sectional view of a stage in a method of manufacturing an integrated circuit device, according to an embodiment.
Figure 7B:
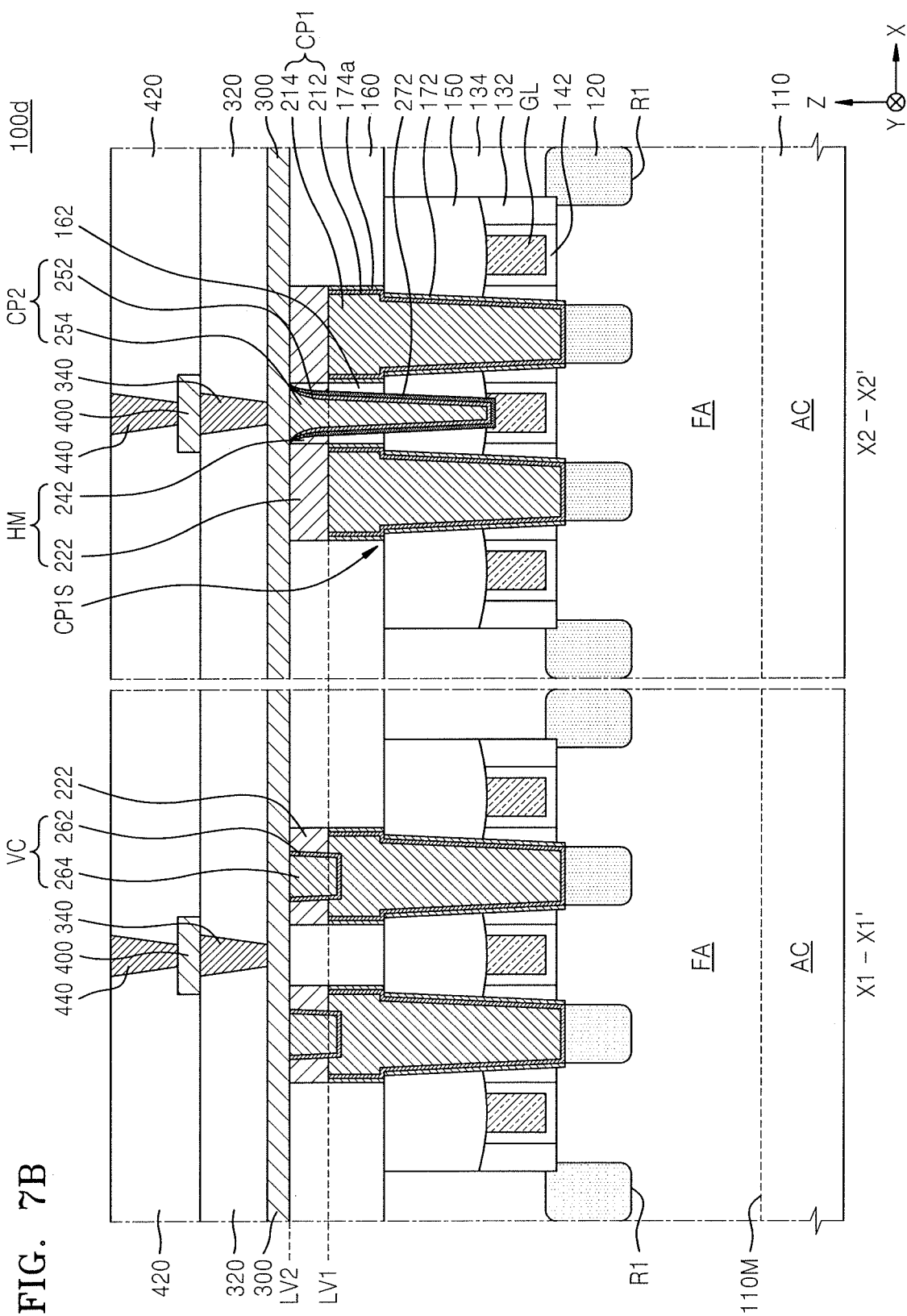
FIG. 7B illustrates a cross-sectional view of an integrated circuit device according to an embodiment.

FIG. 7A illustrates a cross-sectional view of a stage in a method of manufacturing an integrated circuit device, according to an embodiment. FIG. 7B illustrates a cross-sectional view of an integrated circuit device 100d according to an embodiment. For example, FIGS. 7A and 7B illustrate cross-sectional views taken along lines X1-X1' and X2-X2' of FIG. 1.

Referring to FIG. 7A, an auxiliary spacer 272 and an auxiliary residual spacer 274 respectively covering an inner surface of the second contact hole CH2 and an inner surface of the third recess space RS3 may be formed on a resultant structure of FIG. 3N.

The auxiliary spacer 272 may cover a side surface of the cover spacer 242, a side surface of the side wall insulating capping layer 162, and a side surface of the gate insulating capping layer 150 in the second contact hole CH2. The auxiliary residual spacer 274 may cover a side surface of a residual spacer 244.

Each of the auxiliary spacer 272 and the auxiliary residual spacer 274 may be formed by forming a preliminary auxiliary spacer layer conformably covering an exposed surface of a resultant structure of FIG. 3N and performing anisotropic etching.

Each of the auxiliary spacer 272 and the auxiliary residual spacer 274 may be formed of, e.g., silicon nitride or a silicon carbide material.

Referring to FIG. 7B, the integrated circuit device 100d may be formed on a resultant structure of FIG. 7A by forming the second conductive plug CP2 by performing a process similar to that of FIGS. 3O through 3Q. In the integrated circuit device 100d, a side surface of the second conductive plug CP2 may be covered by the auxiliary spacer 272.

The integrated circuit device 100d of FIG. 7B is the same as the integrated circuit device 100 of FIGS. 2A and 2B except that the auxiliary spacer 272 covering the side surface of the second conductive plug CP2 is further included, and thus a detailed explanation thereof will not be given.

The auxiliary spacer 272 may be between the side surface of the second conductive plug CP2 and the side surface of the cover spacer 242, the side surface of the side wall insulating capping layer 162, and the side surface of the gate insulating capping layer 150 covering a side surface of the second conductive plug CP2, and may help prevent a short circuit between the first conductive plug CP1 and the second conductive plug CP2.

Figure 8A:
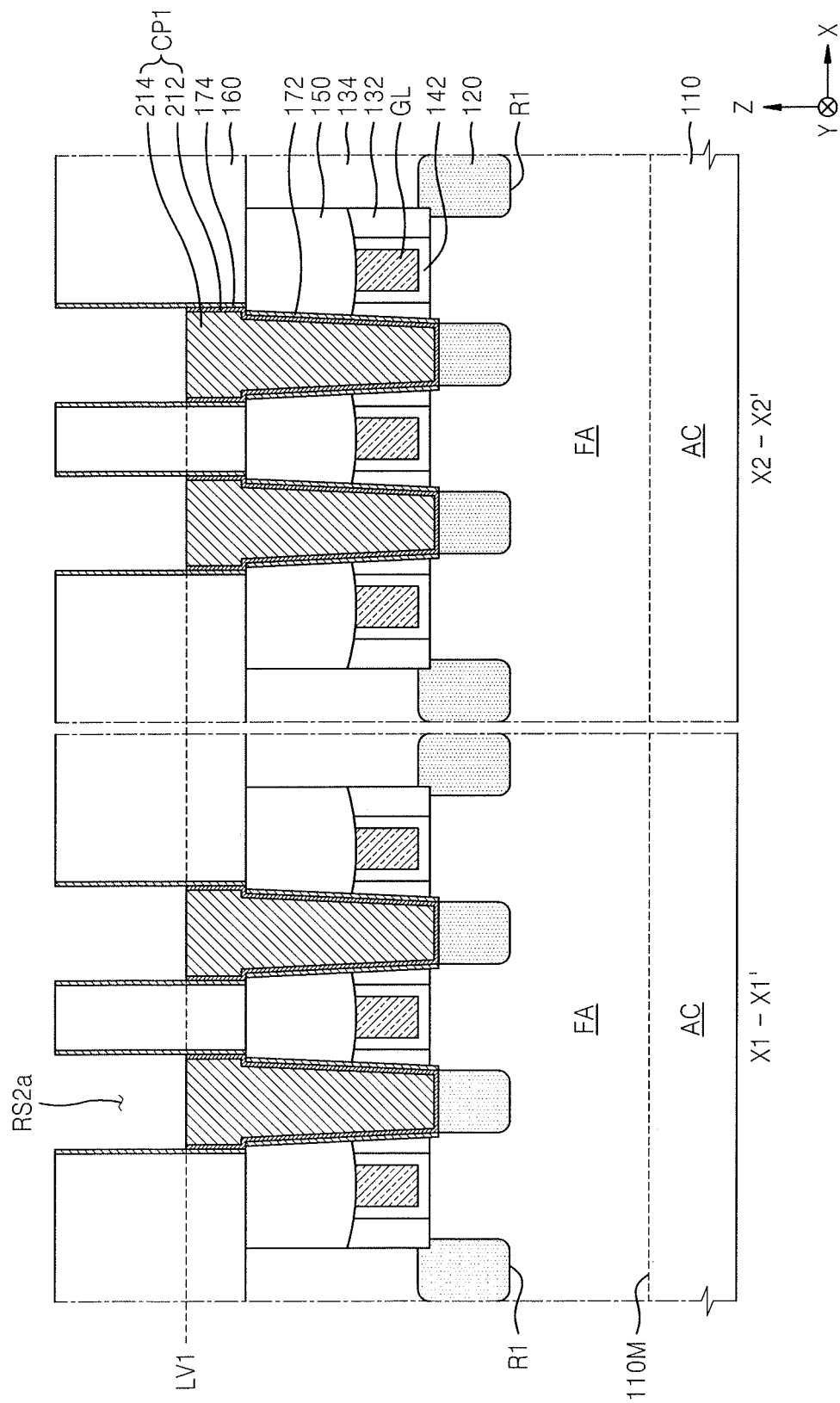
FIGS. 8A and 8B illustrate cross-sectional views of stages in a method of manufacturing an integrated circuit device in a process order, according to an embodiment.
Figure 8B:
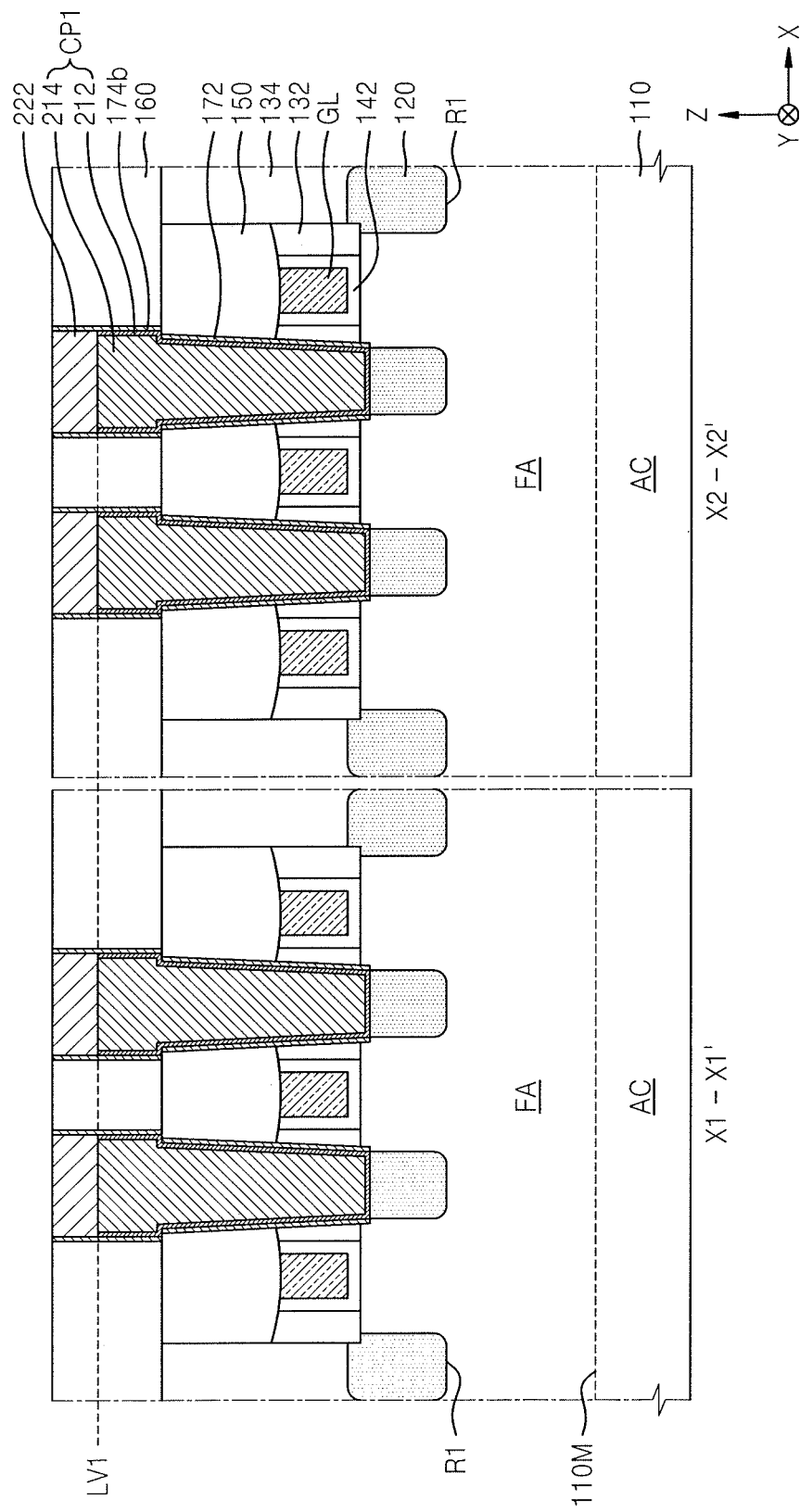
Figure 8C:
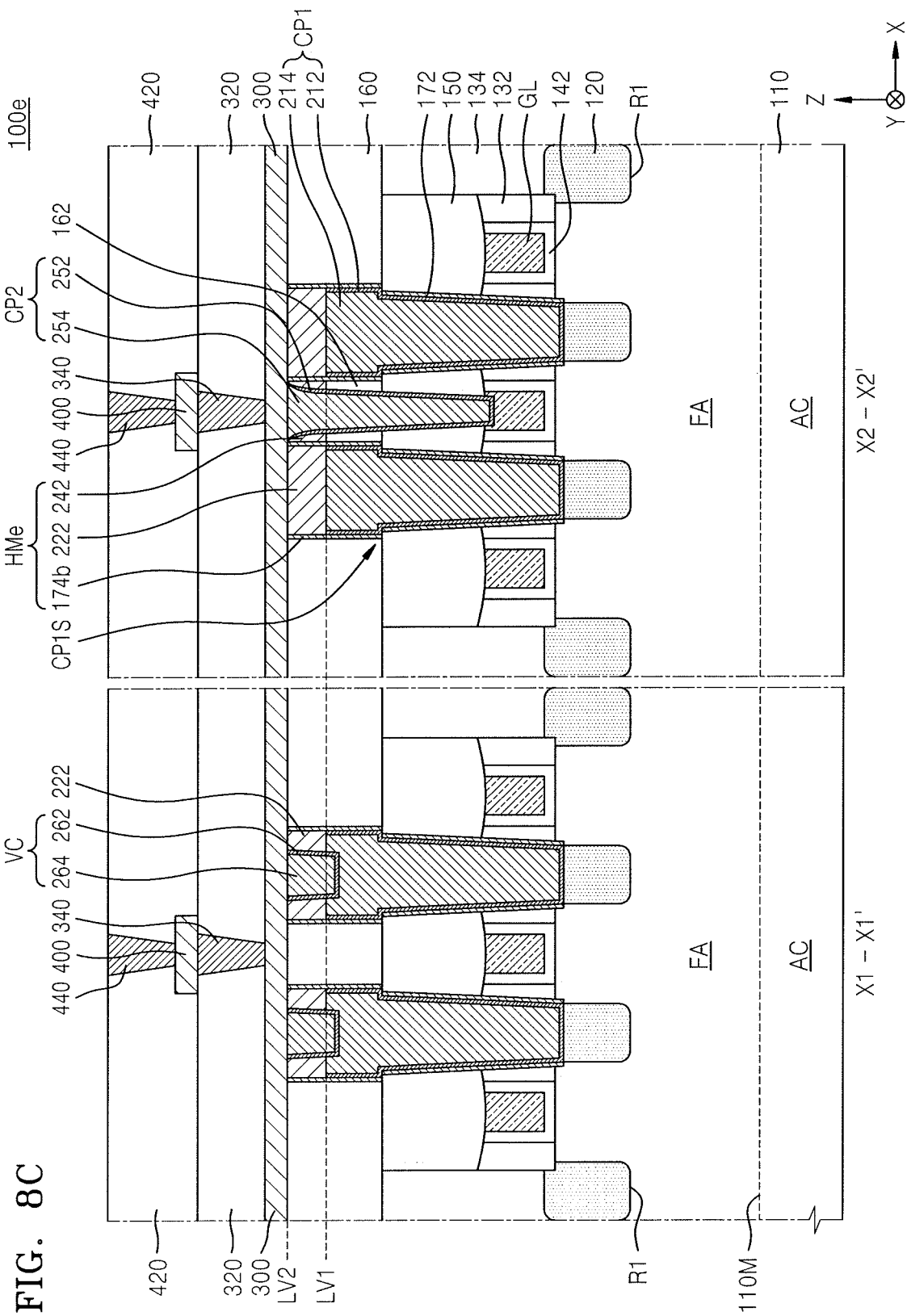
FIG. 8C illustrates a cross-sectional view of an integrated circuit device according to an embodiment.

FIGS. 8A and 8B illustrate cross-sectional views of stages in a method of manufacturing an integrated circuit device in a process order, according to an embodiment. FIG. 8C illustrates a cross-sectional view of an integrated circuit device 100e according to an embodiment. FIGS. 8A through 8C illustrate cross-sectional views taken along lines X1-X1' and X2-X2' of FIG. 1.

Referring to FIG. 8A, the plurality of first conductive plugs CP1 filling lower portions of the plurality of first contact holes CH1 and each including the first conductive barrier layer 212 and the first conductive core layer 214 may be formed on a resultant structure of FIG. 3G by removing unnecessary or selected portions of the first conductive barrier layer 212 and the first conductive core layer 214 so that a top surface of the upper insulating layer 160 is exposed and a plurality of second recess spaces RS2a are formed in upper portions of the plurality of first contact holes CH1 (see FIG. 3F).

In a process of forming the plurality of first conductive plugs CP1, a portion of the second side cover layer 174 that has or is at a level higher than the first level LV1 may not be removed and may remain on inner surfaces of the second recess space RS2a. In an implementation, a width of the portion of the second side cover layer 174 having a level higher than the first level LV1 in the horizontal direction (e.g., the X-Y direction) may be less than a width of a portion of the second side cover layer 174 in the horizontal direction (e.g., the X-Y direction) having a level lower than the first level LV1.

Referring to FIG. 8B, the cover mask layer 222 covering a top surface of the first conductive plug CP1 may be formed by using a process similar to that of FIGS. 3I through 3J. A second side cover layer 174b may cover both a side surface of the first conductive plug CP1 and a side surface of the cover mask layer 222.

Referring to FIG. 8C, the integrated circuit device 100e may be formed by performing a process similar to that of FIGS. 3K through 3Q.

The integrated circuit device 100e of FIG. 8C is the same as the integrated circuit device 100 of FIGS. 2A and 2B except that the second side cover layer 174b upwardly extends from the side surface of the first conductive plug CP1 beyond the first level LV1 in the vertical direction (e.g., the Z direction) to cover the side surface of the cover mask layer 222, and thus a detailed explanation thereof will not be given.

A hard mask layer HMe may include the cover mask layer 222 and the cover spacer 242. A portion of the second side cover layer 174b facing the second conductive plug CP2 may extend from a space between the upper insulating layer 160 and the first conductive plug CP1 to a space between the cover mask layer 222 and the cover spacer 242. Accordingly, the cover mask layer 222 and the cover spacer 242 may face each other with the second side cover layer 174b therebetween.

Figure 9:
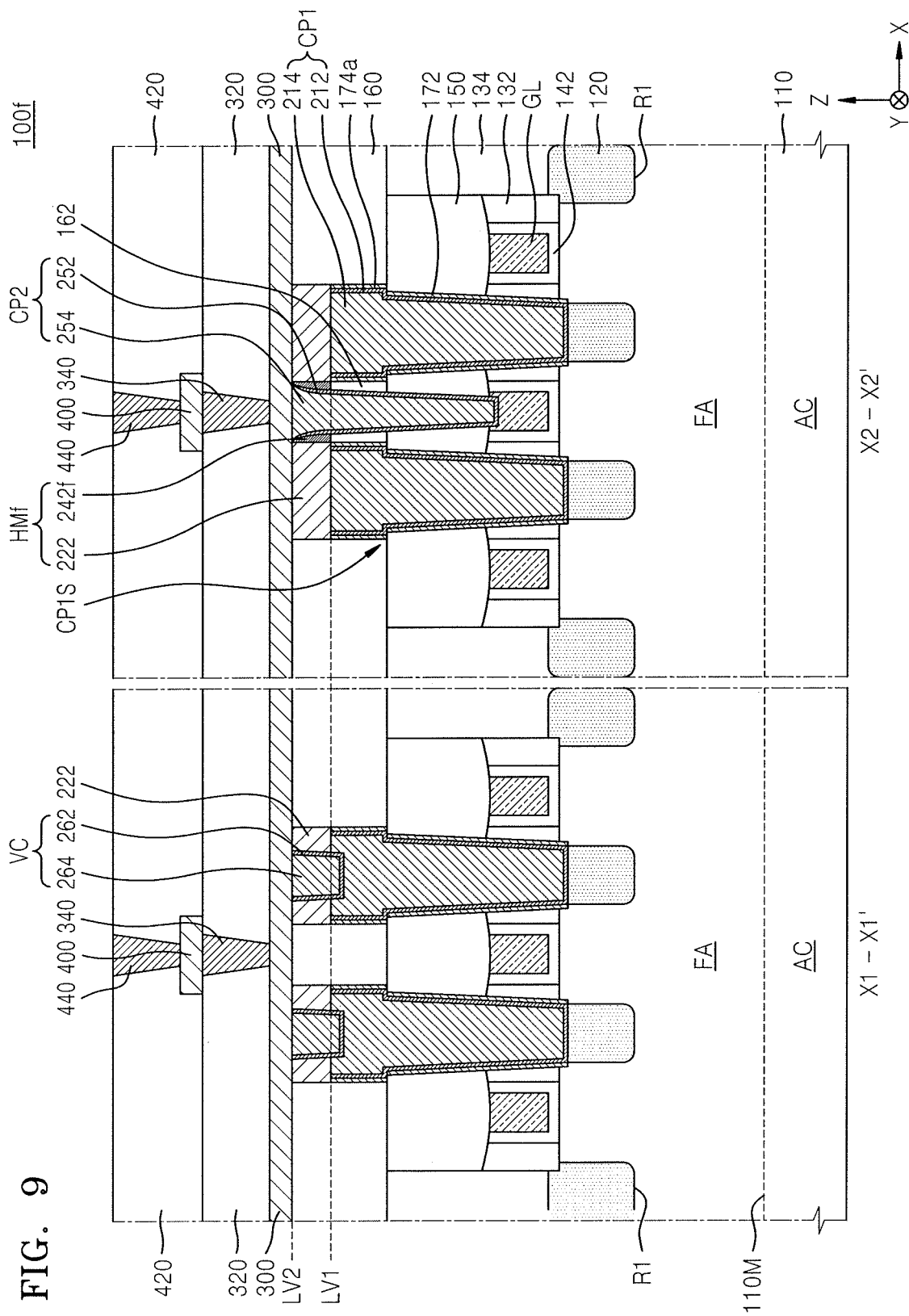
FIG. 9 illustrates a cross-sectional view of an integrated circuit device according to an embodiment.

FIG. 9 illustrates a cross-sectional view of an integrated circuit device 100f according to an embodiment. FIG. 9 illustrates a cross-sectional view taken along lines X1-X1' and X2-X2' of FIG. 1.

Referring to FIG. 9, the integrated circuit device 100f may include the plurality of first conductive plugs CP1 and the second conductive plug CP2. A hard mask layer HMf may be located on the first conductive plug CP1. The hard mask layer HMf may include the cover mask layer 222 covering a top surface of the first conductive plug CP1 and a cover spacer 242f covering a side surface of the cover mask layer 222.

The cover mask layer 222 and the cover spacer 242f may be formed of silicon carbide materials having different carbon contents. For example, a carbon content of a material of the cover mask layer 222 may be less than a carbon content of a material of the cover spacer 242f.

By way of summation and review, in down-scaled integrated circuit devices, distances between wirings and contacts may be reduced and short circuits between the wirings and the contacts may be prevented.

An integrated circuit device according to the one or more embodiments may include a plurality of first conductive plugs located in a device active region and a second conductive plug located between first conductive plugs of one pair of first conductive plugs and having a top surface whose level is higher than a level of a top surface of each of the first conductive plugs. A hard mask layer protruding toward the second conductive plug and overhanging from the top surface of the first conductive plug may be located on the first conductive plug, and a side wall insulating capping layer may be located under a cover spacer that is a portion overhanging from the top surface of the first conductive plug and between the first conductive plug and the second conductive plug.

In the integrated circuit device according to the one or more embodiments, the second conductive plug may be formed by using an SAC process using the hard mask layer including the cover spacer, and an undesirable misalignment may be prevented during an etching process for forming the second conductive plug. Also, in the integrated circuit device according to the one or more embodiments, a horizontal insulating distance between the first conductive plug and the second conductive plug may be secured by using the side wall insulating capping layer formed by the cover spacer, and an insulation margin between the first conductive plug and the second conductive plug may be secured, thereby preventing a short circuit between the first conductive plug and the second conductive plug.

One or more embodiments may provide an integrated circuit device including a conductive plug connected to a transistor.

One or more embodiments may provide an integrated circuit device having a structure in which as the integrated circuit device is down-scaled and the area of a device region is reduced, an insulation margin between conductive plugs that are located adjacent to each other may be secured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing an integrated circuit device, the method comprising:
    preparing a substrate having a device active region;
    forming a fin-type active region, the fin-type active region protruding from the substrate on the device active region;
    forming a gate line and source/drain regions, the gate line intersecting the fin-type active region, and the source/drain regions being located on the fin-type active region at sides of the gate line;
    forming a gate insulating capping layer covering a top surface of the gate line;
    forming an upper insulating layer covering the gate insulating capping layer;
    forming a pair of first contact holes passing through the upper insulating layer and exposing the source/drain regions;
    forming a pair of first conductive plugs filling lower portions of the pair of first contact holes, the pair of first conductive plugs being respectively connected to the source/drain regions;
    forming a hard mask layer covering a top surface of each first conductive plug of the pair of first conductive plugs;
    forming a second contact hole exposing the gate line by removing portions of the upper insulating layer and the gate insulating capping layer; and
    forming a second conductive plug filling the second contact hole,
    wherein the hard mask layer covers the top surface of each first conductive plug from a first edge of the top surface to a second edge of the top surface in a first direction, and protrudes from the top surface beyond the second edge for each first conductive plug of the pair of first conductive plugs and extends toward the second conductive plug so that a portion of the hard mask layer overhangs outside of an edge of the top surface of each first conductive plug of the pair of first conductive plugs.

2. The method as claimed in claim 1, wherein forming the second contact hole includes performing an etching process using the hard mask layer as etch masks.

3. The method as claimed in claim 1, wherein:
    the hard mask layer includes a cover mask layer and a cover spacer covering a side surface of the cover mask layer, and
    forming the hard mask layer includes:
        forming the cover mask layer covering the top surface of each first conductive plug of the pair of first conductive plugs;
        forming a protective insulating layer covering the upper insulating layer and the cover mask layer;
        forming a recess space by removing portions of the protective insulating layer and the upper insulating layer and exposing a portion of the upper insulating layer; and
        forming the cover spacer covering a side surface of the cover mask layer.

4. The method as claimed in claim 3, wherein the second contact hole is in communication with the recess space.

5. The method as claimed in claim 4, wherein:
    the cover spacer overhangs from the top surface of each first conductive plug of the pair first of conductive plugs, and
    the cover spacer protrudes toward the second conductive plug.

6. The method as claimed in claim 3, wherein forming the second contact hole includes forming a side wall insulating capping layer that is a remaining portion of the upper insulating layer under the cover spacer.

7. The method as claimed in claim 6, wherein the side wall insulating capping layer is between a top surface of the gate insulating capping layer and a bottom surface of the hard mask layer and between the pair of first conductive plugs and the second conductive plug.

8. The method as claimed in claim 6, wherein the second conductive plug protrudes laterally toward the side wall insulating capping layer.

9. The method as claimed in claim 6, wherein a top surface of the side wall insulating capping layer contacts a bottom surface of the cover spacer.

10. The method as claimed in claim 3, wherein:
    each of the cover mask layer and the cover spacer includes a silicon carbide material, and the silicon carbide material of the cover spacer has a carbon content that is greater than a carbon content of the silicon carbide material of the cover mask layer.

11. The method as claimed in claim 3, further comprising, forming an auxiliary spacer covering an inner surface of the second contact hole after forming the second contact hole and before forming the second conductive plug.

12. A method of manufacturing an integrated circuit device, the method comprising:
preparing a substrate having a device active region;
forming a fin-type active region, the fin-type active region protruding from the substrate on the device active region;
forming a gate line and source/drain regions, the gate line intersecting the fin-type active region, and the source/drain regions being located on the fin-type active region at sides of the gate line;
forming a gate insulating capping layer covering a top surface of the gate line;
forming an upper insulating layer covering the gate insulating capping layer;
forming a pair of first contact holes passing through the upper insulating layer and exposing the plurality of source/drain regions;
forming a pair of first conductive plugs filling lower portions of the pair of first contact holes, the pair of first conductive plugs being respectively connected to the source/drain regions;
forming a cover mask layer covering a top surface of each first conductive plug of the pair of first conductive plugs;
forming a protective insulating layer covering the upper insulating layer and the cover mask layer;
forming a recess space by removing portions of the protective insulating layer and the upper insulating layer and exposing a portion of the upper insulating layer;
forming a cover spacer covering a side surface of the cover mask layer;
forming a second contact hole exposing the gate line by removing portions of the upper insulating layer and gate insulating capping layer by using the cover mask layer and the cover spacer as etch masks; and
forming a second conductive plug filling the second contact hole.

13. The method as claimed in claim 12, wherein, after forming the second contact hole, a side wall insulating capping layer that is a remaining portion of the upper insulating layer, is located between a top surface of the gate insulating capping layer and a bottom surface of the cover spacer.

14. The method as claimed in claim 13, wherein the bottom surface of the cover spacer is at a same level as the top surface of each first conductive plug of the pair of first conductive plugs.

15. The method as claimed in claim 13, wherein the bottom surface of the cover spacer is at a level that is higher than a level of the top surface of each first conductive plug of the pair of first conductive plugs.

16. The method as claimed in claim 13, wherein the bottom surface of the cover spacer is at a level that is lower than a level of the top surface of each first conductive plug of the pair of first conductive plugs.

17. The method as claimed in claim 12, wherein a top surface of the cover mask layer is at a same level as a top surface of the second conductive plug.

18. The method as claimed in claim 12, wherein the cover spacer overhangs from the top surface of each first conductive plug of the pair of first conductive plugs and protrudes toward the second conductive plug.

19. The method as claimed in claim 12, wherein forming the cover spacer includes:
forming a preliminary spacer layer covering a top surface of the protective insulating layer and an inner surface and a bottom surface of the recess space, and
removing a portion of the preliminary spacer layer by performing anisotropic etching.

20. The method as claimed in claim 12, wherein forming the second conductive plug includes:
sequentially forming a second conductive barrier layer and a second conductive core layer filling the second contact hole in the recess space; and
removing the protective insulating layer and portions of the second conductive barrier layer and the second conductive core layer to expose a top surface of the cover mask layer.

* * * * *